(12) United States Patent
Park et al.

(10) Patent No.: US 12,432,973 B2
(45) Date of Patent: Sep. 30, 2025

(54) SEMICONDUCTOR DEVICE

(71) Applicant: SAMSUNG ELECTRONICS CO., LTD., Suwon-si (KR)

(72) Inventors: Beomjin Park, Hwaseong-si (KR); Hyojin Kim, Hwaseong-si (KR); Myung Gil Kang, Suwon-si (KR); Jinbum Kim, Seoul (KR); Sangmoon Lee, Suwon-si (KR); Dongwon Kim, Seongnam-si (KR); Keun Hwi Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 621 days.

(21) Appl. No.: 17/725,180

(22) Filed: Apr. 20, 2022

(65) Prior Publication Data
US 2023/0051602 A1 Feb. 16, 2023

(30) Foreign Application Priority Data
Aug. 13, 2021 (KR) .................. 10-2021-0107077

(51) Int. Cl.
*H10D 30/67* (2025.01)
*H10D 64/01* (2025.01)

(52) U.S. Cl.
CPC ..... *H10D 30/6735* (2025.01); *H10D 30/6713* (2025.01); *H10D 30/6757* (2025.01); *H10D 64/021* (2025.01)

(58) Field of Classification Search
CPC ......... H01L 29/42392; H01L 29/78696; H01L 29/6656; H10D 30/6735; H10D 64/021; H10D 84/0184; H10D 84/0147
See application file for complete search history.

(56) References Cited

U.S. PATENT DOCUMENTS 9,893,167 B2   2/2018   Kim et al.
9,972,685 B2   5/2018   Mears et al.
(Continued)

FOREIGN PATENT DOCUMENTS

KR   10-2021-0098309 A   8/2021

OTHER PUBLICATIONS

Meng, et al., "Atomic Layer Deposition of Silicon Nitride Thin Films: A Review of Recent Progress, Challenges, and Outlooks", Materials 2016, 9, 1007 (Year: 2016).*

*Primary Examiner* — Erik Kielin
(74) *Attorney, Agent, or Firm* — Sughrue Mion, PLLC

(57) ABSTRACT

A semiconductor device is provided. The semiconductor device includes: an active pattern provided on a substrate and extending in a first direction; a pair of source/drain patterns provided on the active pattern and spaced apart from each other in the first direction; a plurality of channel layers vertically stacked and spaced apart from each other on the active pattern between the pair of source/drain patterns; a gate electrode extending in a second direction between the pair of source/drain patterns, the gate electrode being provided on the active pattern and surrounding the plurality of channel layers, and the second direction intersecting the first direction; and a gate spacer provided between the plurality of channel layers, and between the gate electrode and the pair of source/drain patterns. The gate spacer includes a plurality of first spacer patterns and a plurality of second spacer patterns that are alternately stacked on sidewalls of the pair of source/drain patterns.

20 Claims, 24 Drawing Sheets

(56) References Cited

U.S. PATENT DOCUMENTS

| | | |
|---|---|---|
| 10,181,510 B2 | 1/2019 | Yang et al. |
| 10,361,309 B2 | 7/2019 | Lee et al. |
| 10,431,585 B2 | 10/2019 | Yang et al. |
| 10,522,616 B2 | 12/2019 | Cho et al. |
| 10,825,915 B2 | 11/2020 | Lee et al. |
| 10,854,717 B2 | 12/2020 | Takeuchi et al. |
| 10,886,369 B2 | 1/2021 | Zhang et al. |
| 11,444,177 B2 | 9/2022 | Lin et al. |
| 2019/0006485 A1* | 1/2019 | Kim ............... H01L 29/0673 |
| 2019/0198645 A1* | 6/2019 | Cheng ............ H01L 29/66742 |
| 2020/0220015 A1 | 7/2020 | Jang et al. |
| 2020/0381305 A1 | 12/2020 | Ando et al. |
| 2021/0013324 A1 | 1/2021 | Kim et al. |
| 2021/0036106 A1 | 2/2021 | Shin et al. |
| 2021/0098625 A1* | 4/2021 | Tsai ............... H01L 29/0673 |
| 2021/0098631 A1 | 4/2021 | Fung et al. |
| 2021/0135011 A1 | 5/2021 | Ju et al. |
| 2021/0242327 A1* | 8/2021 | Lin ............... H01L 29/0649 |
| 2023/0029232 A1* | 1/2023 | Cheng ............ H01L 29/78696 |

\* cited by examiner

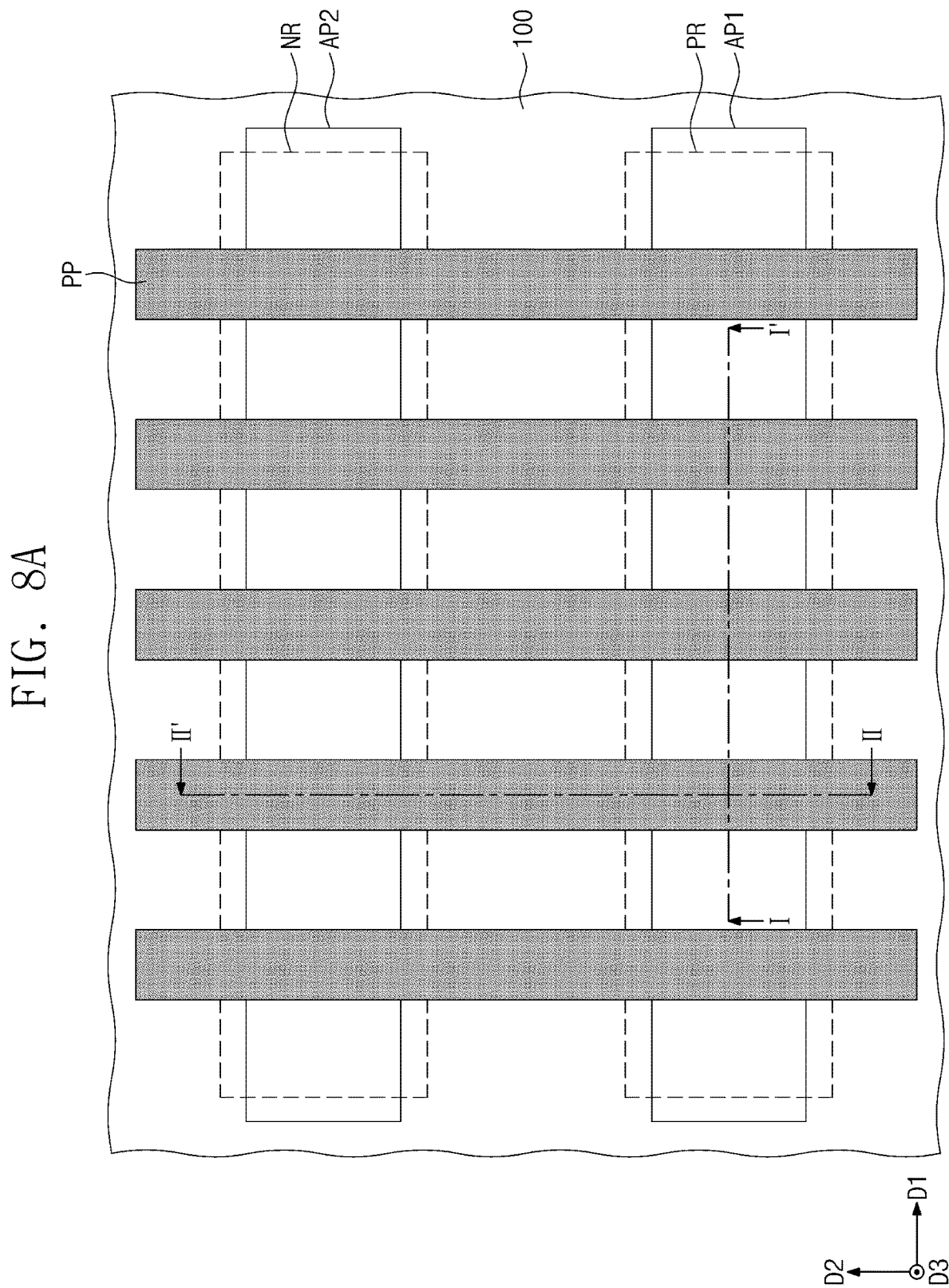

SEMICONDUCTOR DEVICE

CROSS-REFERENCE TO RELATED APPLICATION

This application claims priority under to Korean Patent Application No. 10-2021-0107077 filed on Aug. 13, 2021 in the Korean Intellectual Property Office, the disclosure of which is hereby incorporated by reference in its entirety.

BACKGROUND

The present disclosure relates to a semiconductor device, and more particularly, to a semiconductor device including a field effect transistor and a method of fabricating the same.

A semiconductor device includes an integrated circuit including metal oxide semiconductor field effect transistors (MOSFETs). As sizes and design rules of the semiconductor device are gradually decreased, sizes of the MOSFETs are also increasingly scaled down in size, which may deteriorate operating characteristics of the semiconductor device. Accordingly, various studies have been conducted to develop methods of fabricating semiconductor devices having superior performances while overcoming limitations caused by high integration of the semiconductor devices.

SUMMARY

One or more example embodiments provide a semiconductor device with improved electrical characteristics and increased reliability, and a method of fabricating the same.

Example embodiments are not limited to the mentioned above, and other objects which have not been mentioned above will be clearly understood to those skilled in the art from the following description.

According to an example embodiment, a semiconductor device includes: an active pattern provided on a substrate and extending in a first direction; a pair of source/drain patterns provided on the active pattern and spaced apart from each other in the first direction; a plurality of channel layers vertically stacked and spaced apart from each other on the active pattern between the pair of source/drain patterns; a gate electrode extending in a second direction between the pair of source/drain patterns, the gate electrode being provided on the active pattern and surrounding the plurality of channel layers, and the second direction intersecting the first direction; and a gate spacer provided between the plurality of channel layers, and between the gate electrode and the pair of source/drain patterns. The gate spacer includes a plurality of first spacer patterns and a plurality of second spacer patterns that are alternately stacked on sidewalls of the pair of source/drain patterns.

According to an example embodiment, a semiconductor device includes: an active pattern provided on a substrate and extending in a first direction; a pair of source/drain patterns provided on the active pattern and spaced apart from each other in the first direction; a plurality of channel layers vertically stacked and spaced apart from each other on the active pattern between the pair of source/drain patterns; a gate electrode extending in a second direction between the pair of source/drain patterns, the gate electrode being provided on the active pattern and surrounding the plurality of channel layers, and the second direction intersecting the first direction; a gate dielectric pattern provided between the pair of source/drain patterns and the plurality of channel layers; a plurality of first gate spacers vertically extending from a top surface of an uppermost one of the plurality of channel layers past a top surface of the gate electrode; a plurality of second gate spacers provided between the gate electrode and the pair of source/drain patterns, the plurality of second gate spacers overlapping the plurality of first gate spacers along a third direction perpendicular to the first direction and the second direction; a gate capping pattern provided between the plurality of first gate spacers on the top surface of the gate electrode; an interlayer dielectric layer provided on top surfaces of the pair of source/drain patterns, sidewalls of the plurality of first gate spacers, and a top surface of the gate capping pattern; a plurality of active contacts penetrating the interlayer dielectric layer to the pair of source/drain patterns; and a gate contact penetrating the gate capping pattern and the interlayer dielectric layer to the gate electrode. Each of the plurality of second gate spacers includes a plurality of first spacer patterns alternately stacked with a plurality of second spacer patterns that on a sidewall of the gate dielectric pattern.

According to an example embodiment, a semiconductor device includes: a substrate including a first cell region and a second cell region; a first active pattern extending in a first direction on the first cell region, and a second active pattern extending in the first direction on the second cell region; a pair of first source/drain patterns provided on the first active pattern, and a pair of second source/drain patterns provided on the second active pattern; a plurality of channel layers vertically stacked and spaced apart from each other on each of the first active pattern and the second active pattern, the plurality of channel layers provided on the first active pattern being provided between the pair of first source/drain patterns, and the plurality of channel layers provided on the second active pattern being provided between the pair of second source/drain patterns; a gate electrode extending in a second direction between the pair of first source/drain patterns and between the pair of second source/drain patterns, the gate electrode crossing both the first active pattern and the second active pattern, and surrounding the plurality of channel layers, and the second direction intersecting the first direction; and a gate spacer provided between the pair of first source/drain patterns and the gate electrode, and between the pair of second source/drain patterns and the gate electrode. The gate spacer includes a plurality of first spacer patterns and a plurality of second spacer patterns that are alternately stacked on a sidewall of the gate electrode.

According to an example embodiment, a semiconductor device includes: an active pattern provided on a substrate and extending in a first direction; a pair of source/drain patterns provided on the active pattern and spaced apart from each other in the first direction; a plurality of channel layers vertically stacked and spaced apart from each other on the active pattern between the pair of source/drain patterns; a gate electrode extending in a second direction between the pair of source/drain patterns, the gate electrode being provided on the active pattern and surrounding the plurality of channel layers, and the second direction intersecting the first direction; and a gate spacer provided between the gate electrode and the pair of source/drain patterns along the first direction, and between each of the pair of source/drain patterns and the substrate along a third direction perpendicular to the first direction and the second direction. The gate spacer includes a plurality of first spacer patterns and a plurality of second spacer patterns that are alternately stacked on sidewalls of the pair of source/drain patterns, and between each of the pair of source/drain patterns and the substrate.

BRIEF DESCRIPTION OF THE DRAWINGS

The above and other aspects, features, and advantages will be more clearly understood from the following detailed description, taken in conjunction with the accompanying drawings, in which:

FIGS. 7A, 8A, 10A, 14A, and 16A illustrate plan views showing a method of fabricating a semiconductor device according to some example embodiments.

DETAILED DESCRIPTION

Example embodiments will now be described more fully with reference to the accompanying drawings, in which example embodiments are shown. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
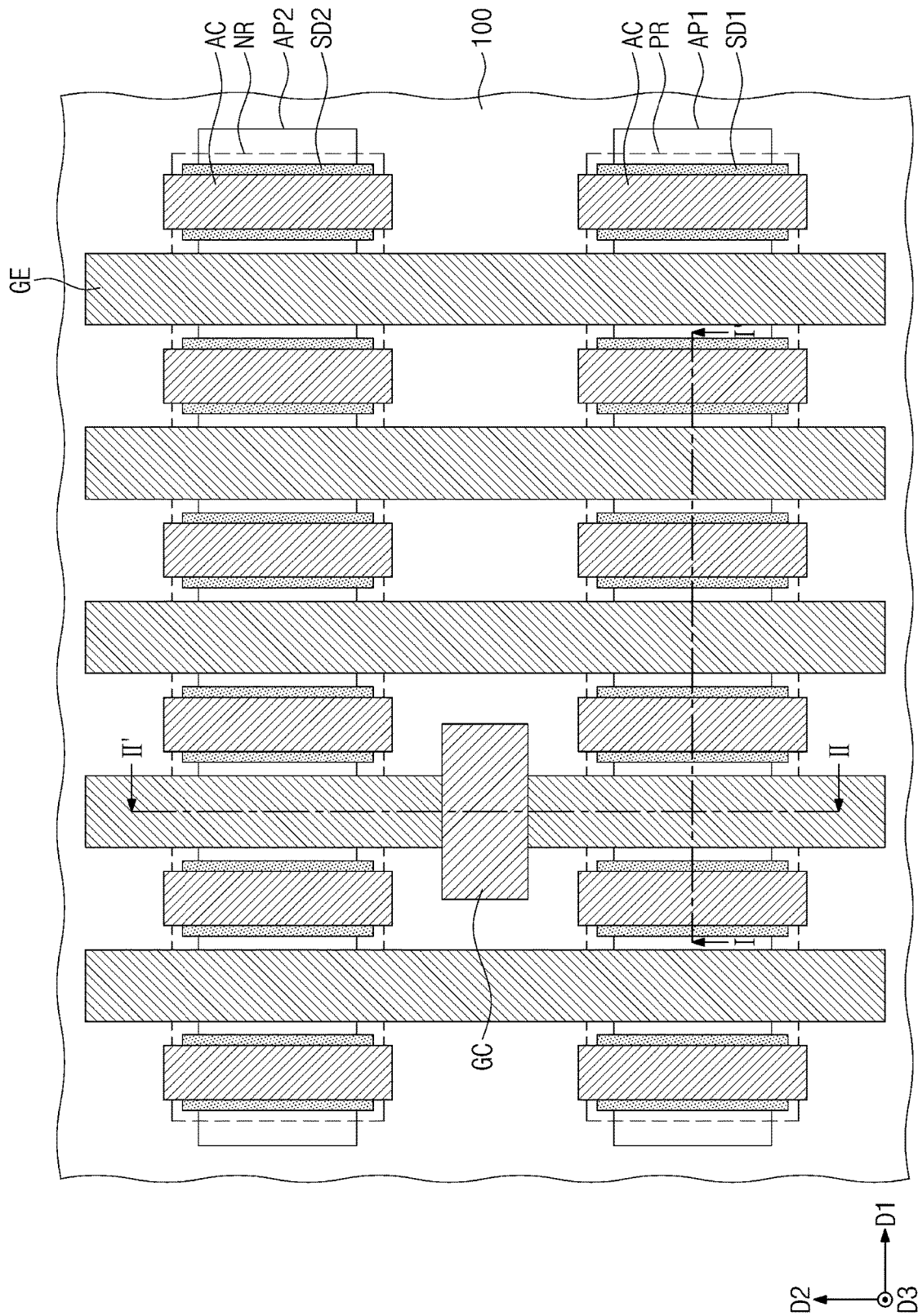
FIG. 1 illustrates a plan view showing a semiconductor device according to some example embodiments.
Figure 2:
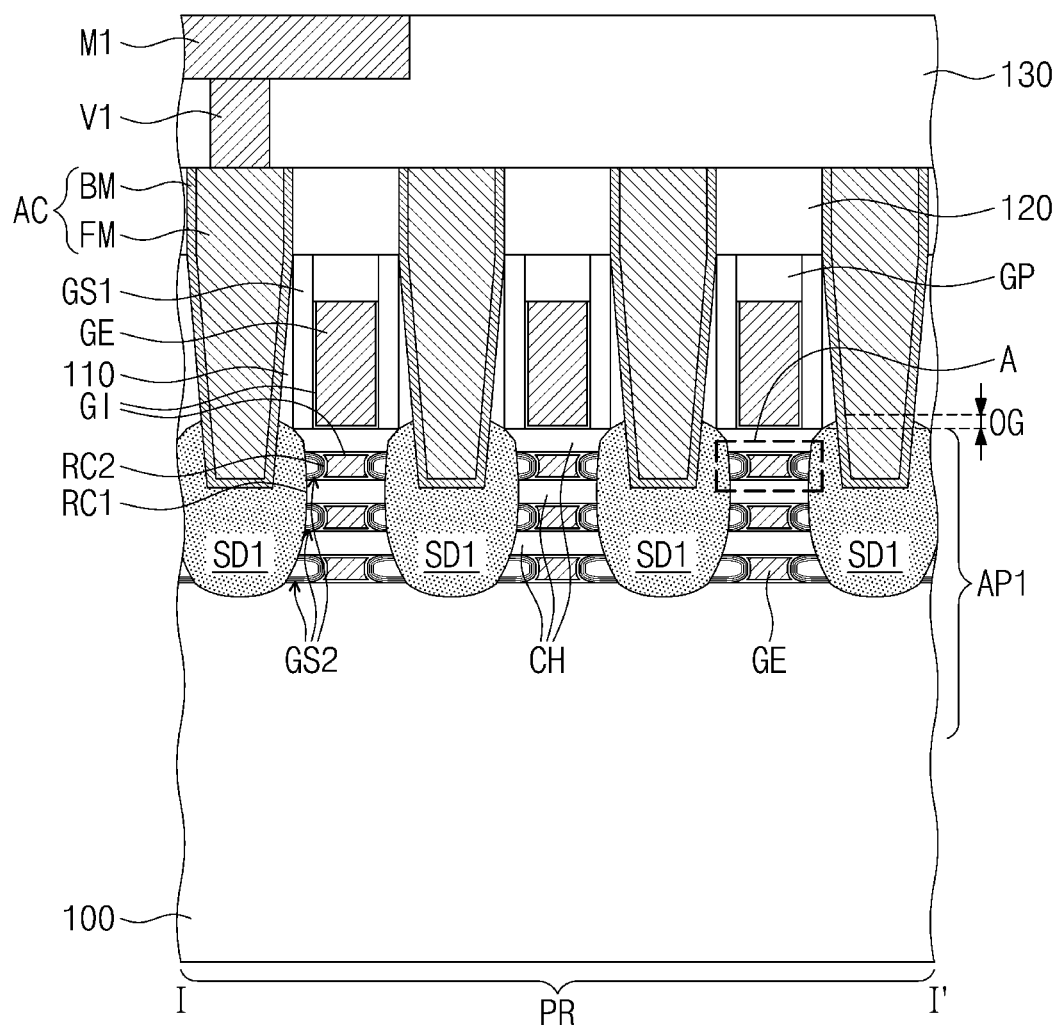
FIGS. 2 and 3 illustrate cross-sectional views respectively taken along lines I-I' and II-II' of FIG. 1, showing a semiconductor device according to some example embodiments.
Figure 3:
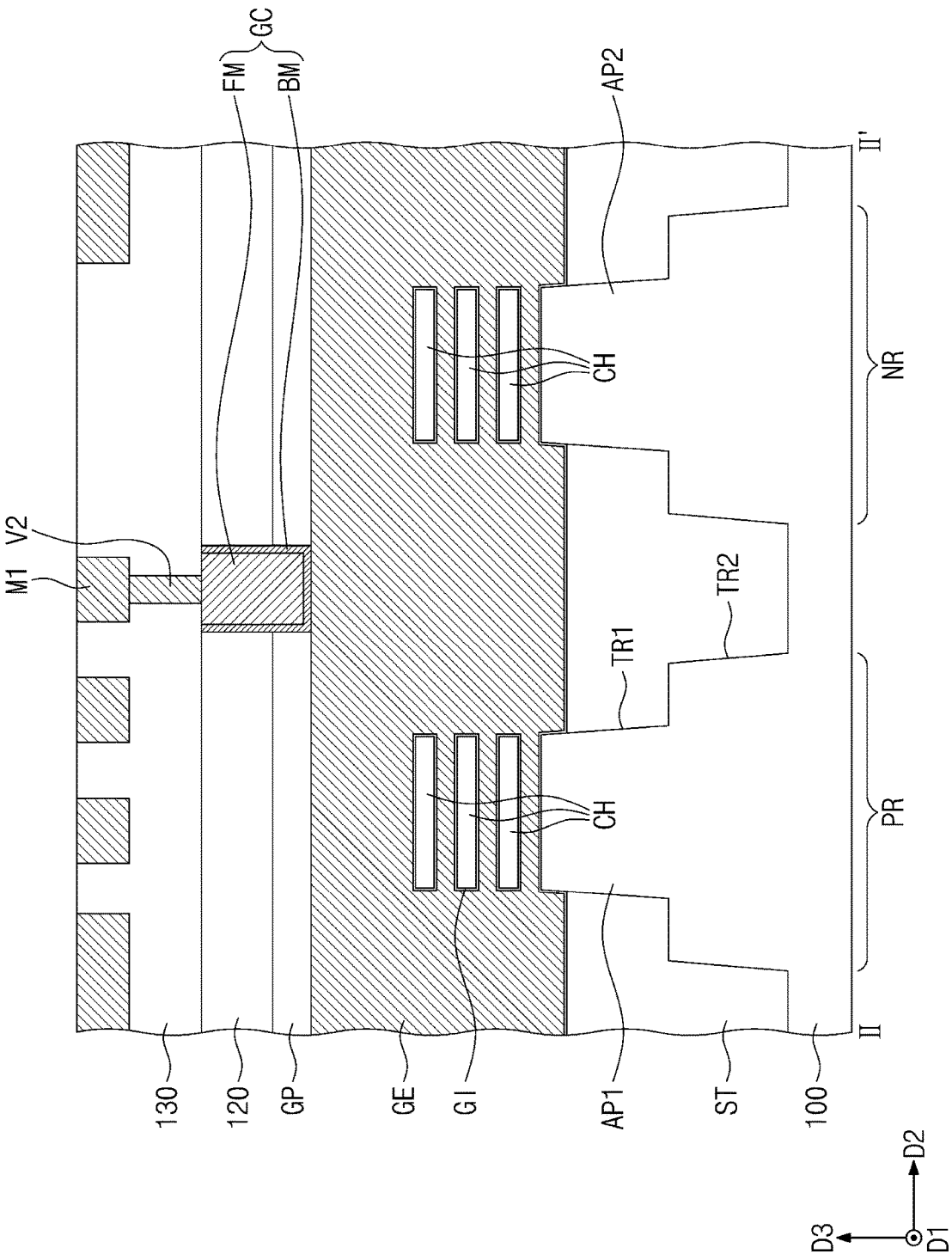

FIG. 1 illustrates a plan view showing a semiconductor device according to some example embodiments. FIGS. 2 and 3 illustrate cross-sectional views respectively taken along lines I-I' and II-II' of FIG. 1, showing a semiconductor device according to some example embodiments.

Referring to FIGS. 1, 2, and 3, a substrate 100 may be provided which includes a first cell region PR and a second cell region NR. The substrate 100 may be a compound semiconductor substrate or a semiconductor substrate including one of silicon (Si), germanium (Ge), and silicon-germanium (SiGe). For example, the substrate 100 may be a silicon substrate. The substrate 100 may have a top surface that is parallel to a first direction D1 and a second direction D2 and is perpendicular to a third direction D3. The first, second, and third directions D1, D2, and D3 may be orthogonal to each other. It is understood here that the D1 and D2 directions are also referred to channel width and length directions, respectively.

The first cell region PR and the second cell region NR may be defined by a second trench TR2 formed on an upper portion of the substrate 100. The second trench TR2 may be positioned between the first cell region PR and the second cell region NR. The first cell region PR and the second cell region NR may be spaced apart from each other in the second direction D2 across the second trench TR2.

The first cell region PR and the second cell region NR may each be an area where a standard cell that constitutes a logic circuit is provided. For example, the first cell region PR may be an area where PMOS field effect transistors are disposed, and the second cell region NR may be an area where NMOS field effect transistors are disposed.

A first trench TR1 formed on the upper portion of the substrate 100 may define a first active pattern AP1 and a second active pattern AP2. The first active pattern AP1 and the second active pattern AP2 may be respectively provided on the first cell region PR and the second cell region NR. The first trench TR1 may be shallower than the second trench TR2. The first and second active patterns AP1 and AP2 may extend in the first direction D1 and may be spaced apart from each other in the second direction D2. The first and second active patterns AP1 and AP2 may be portions of the substrate 100 that protrude in the third direction D3. The first and second active patterns AP1 and AP2 may each have widths in the first direction D1 and the second direction D2 that decrease in the third direction D3.

A device isolation layer ST may be provided in, and for example may fill the first and second trenches TR1 and TR2. The device isolation layer ST may include silicon oxide. The first and second active patterns AP1 and AP2 may have upper portions that vertically protrude upward from the device isolation layer ST (see FIG. 3). The device isolation layer ST may not be provided on either the upper portion of the first active pattern AP1 nor the upper portion of the second active pattern AP2. The device isolation layer ST may be provided on portions of sidewalls of the first and second active patterns AP1 and AP2.

Each of the first and second active patterns AP1 and AP2 may include a plurality of stacked channel layers CH. The channel layers CH may be provided on the upper portion of each of the first and second active patterns AP1 and AP2. The channel layers CH may be spaced apart from each other in the third direction D3. The channel layers CH may include, for example, one of silicon (Si), germanium (Ge), and silicon-germanium (SiGe). For example, the channel layers CH may include silicon (Si).

A pair of first source/drain patterns SD1 may be provided on the upper portion of the first active pattern AP1. For example, the first source/drain patterns SD1 may be impurity regions having a first conductivity type (e.g., p-type). The channel layers CH may be provided between the pair of first source/drain patterns SD1.

A pair of second source/drain patterns SD2 may be provided on the upper portion of the second active pattern AP2. For example, the second source/drain patterns SD2 may be impurity regions having a second conductivity type (e.g., n-type). The channel layers CH may be provided between the pair of second source/drain patterns SD2.

The first and second source/drain patterns SD1 and SD2 may be epitaxial patterns formed by a selective epitaxial growth process. For example, each of the first and second source/drain patterns SD1 and SD2 may have a top surface located at a higher level than that of a top surface of an uppermost one of the channel layers CH. A range of about 1 nm to about 10 nm may be given as a level difference OG between the top surface of each of the first and second source/drain patterns SD1 and SD2 and the top surface of the uppermost one of the channel layers CH.

The first source/drain patterns SD1 may include a semiconductor element (e.g., SiGe) whose lattice constant is greater than that of a semiconductor element of the substrate 100. The first source/drain patterns SD1 may provide the channel layers CH with compressive stress. The second source/drain patterns SD2 may include the same semiconductor element (e.g., Si) as that of the substrate 100. The first source/drain patterns SD1 and the first active pattern AP1 on the first cell region PR are discussed later, and this description will be applied substantially identically to the second source/drain patterns SD2 and the second active pattern AP2 on the second cell region NR.

A gate electrode GE may be provided to extend in the second direction D2, and cross the first and second active patterns AP1 and AP2. The gate electrode GE may be provided in plural. The plurality of gate electrodes GE may be spaced apart from each other in the first direction D1. A single gate electrode GE is discussed later for the purpose of convenience, and this description will be applied substantially identically to other gate electrodes GE.

A portion of the gate electrode GE may overlap, in the third direction D3, with the channel layers CH. The gate electrode GE may include a first part provided on the uppermost channel layer CH and second parts provided between the first source/drain patterns SD1. Between the channel layers CH, each of the second parts of the gate electrode GE may extend in the second direction D2 and along a bottom surface of the first part of the gate electrode GE. The gate electrode GE may be provided on, and for example may cover, a top surface, a bottom surface, and sidewalls of each of the channel layers CH. Each of transistors on the first and second cell regions PR and NR may be a three-dimensional field effect transistor (or gate-all-around type transistor) in which the gate electrode GE three-dimensionally surrounds the channel layers CH.

The gate electrode GE may include, for example, one or more of doped semiconductor, conductive metal nitride, and metal. For example, the gate electrode GE may include a plurality of metal patterns that are different from each other. The plurality of metal patterns may have different resistances from each other. A composition and/or thickness of each of the plurality of metal patterns may be adjusted to achieve desired threshold voltages of transistors.

First gate spacers GS1 and second gate spacers GS2 may be provided on sidewalls of the gate electrode GE. Each of the first gate spacers GS1 may extend in the second direction D2 along one sidewall of the gate electrode GE. Each of the first gate spacers GS1 may extend in the third direction D3 from the top surface of the uppermost channel layer CH of the gate electrode GE. Each of the first gate spacers GS1 may have a top surface located at a higher level than that of an uppermost top surface of the gate electrode GE. The top surface of each of the first gate spacers GS1 may be substantially coplanar with that of the gate capping pattern GP. The first gate spacers GS1 may include a nitride-based dielectric material. The first gate spacers GS1 may include, for example, at least one selected from SiCN, SiCON, and SiN. Alternatively, the first gate spacers GS1 may include multiple layers that consist of at least two selected from SiCN, SiCON, and SiN.

The second gate spacers GS2 may be horizontally provided (i.e., along the first direction D1) between the gate electrode GE and the first source/drain patterns SD1. The second gate spacers GS2 may be vertically provided (i.e., along the third direction D3) between the channel layers CH, and may overlap, in the third direction D3, the first gate spacers GS1. The gate electrode GE may be spaced apart from the first source/drain patterns SD1 in the first direction D1 by the second spacers GS2. Each of the second gate spacers GS2 will be discussed in detail with reference to FIGS. 4 and 5.

A gate capping pattern GP may be provided on the gate electrode GE. The gate capping pattern GP may extend in the second direction D2 along the gate electrode GE. The gate capping pattern GP may include a material having an etch selectivity with respect to first and second interlayer dielectric layers 110 and 120 which will be discussed later. The gate capping pattern GP may include, for example, at least one selected from SiON, SiCN, SiCON, and SiN.

A gate dielectric pattern GI may be provided between the gate electrode GE and the channel layers CH. The gate dielectric pattern GI may extend between the gate electrode GE and the first gate spacers GS1, and between the gate electrode GE and the second gate spacers GS2. The gate dielectric pattern GI may have an uppermost surface substantially coplanar with that of the gate electrode GE. The gate electrode GE may be spaced apart from the first and second gate spacers GS1 and GS2 across the gate dielectric pattern GI.

The gate dielectric pattern GI may include, for example, an interfacial layer including at least one of silicon oxide, silicon nitride, and silicon oxynitride, not being limited thereto, and a high-k dielectric layer. The high-k dielectric layer may include a material, such as hafnium oxide (HfO), aluminum oxide (AlO), or tantalum oxide (TaO), not being limited thereto, of which a dielectric constant is greater than that of silicon oxide and that of silicon nitride.

A first interlayer dielectric layer 110 may be provided on the substrate 100. The first interlayer dielectric layer 110 may be provided on the sidewalls of the first gate spacers GS1 and the top surfaces of the first source/drain patterns SD1. The first interlayer dielectric layer 110 may have a top surface substantially coplanar with that of the gate capping pattern GP and those of the first gate spacers GS1. A second interlayer dielectric layer 120 may be provided on the first interlayer dielectric layer 110, the top surface of the gate capping pattern GP and the top surfaces of the first gate spacers GS1. For example, the first and second interlayer dielectric layers 110 and 120 may include silicon oxide.

Active contacts AC may be provided to penetrate the first and second interlayer dielectric layers 110 and 120, and to electrically connect with the first source/drain patterns SD1. A pair of active contacts AC may be provided on opposite sides of the gate electrode GE. When viewed in plan, each of the active contacts AC may have a bar shape that extends in the second direction D2.

Each of the active contacts AC may include a conductive pattern FM and a barrier pattern BM that surrounds the conductive pattern FM. For example, the conductive pattern FM may include at least one metal selected from aluminum, copper, tungsten, molybdenum, and cobalt. The barrier pattern BM may be provided on a sidewall and a bottom surface of the conductive pattern FM. The barrier pattern BM may include one or both of a metal layer and a metal nitride layer. The metal layer may include at least one selected from titanium, tantalum, tungsten, nickel, cobalt, and platinum. The metal nitride layer may include at least one selected from a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

The active contacts AC may be self-aligned contacts. For example, the gate capping pattern GP and the first gate spacers GS1 may be used to form the active contacts AC in a self-alignment manner. For example, the active contacts AC may be provided on at least portions of the sidewalls of the first gate spacers GS1. According to some example embodiments, the active contacts AC may be provided on portions of the top surfaces of the gate capping patterns GP.

A silicide pattern may be provided between the active contact AC and the first source/drain pattern SD1. Each of the active contacts AC may be electrically connected through the silicide pattern to one of the first source/drain patterns SD1. The silicide pattern may include metal silicide.

A gate contact GC may be provided to penetrate the second interlayer dielectric layer 120 and the gate capping pattern GP, and to electrically connect with the gate electrode GE. For example, the gate contact GC may be provided on the device isolation layer ST between the first cell region PR and the second cell region NR. When viewed in plan, the gate contact GC may have a bar shape that extends in the first direction D1. Similar to the active contact AC, the gate contact GC may include a conductive pattern FM and a barrier pattern BM that surrounds the conductive pattern FM.

A third interlayer dielectric layer 130 may be provided on the second interlayer dielectric layer 120. The third interlayer dielectric layer 130 may be provided therein with first wiring lines M1, the first via V1, and a second via V2. The first and second vias V1 and V2 may be provided below the first wiring lines M1. The first wiring lines M1 may extend in the first direction D1. The first wiring lines M1 may be arranged along the first direction D1 or the second direction D2. The first via V1 may be provided between and electrically connect one of the first wiring lines M1 and one of the active contacts AC. The second via V2 may be provided between and electrically connect the gate contact GC and one of the first wiring lines M1.

The first wiring lines M1 and one of the first and second vias V1 and V2 may be integrally connected into a single conductive structure. For example, the first wiring lines M1 may be formed simultaneously with one of the first and second vias V1 and V2. A dual damascene process may be performed such that the first wiring lines M1 and one of the first and second vias V1 and V2 may be formed into a single conductive structure. Additional metal layers (e.g., M2, M3, M4, etc.) may further be provided on the third interlayer dielectric layer 130.

Figure 4:
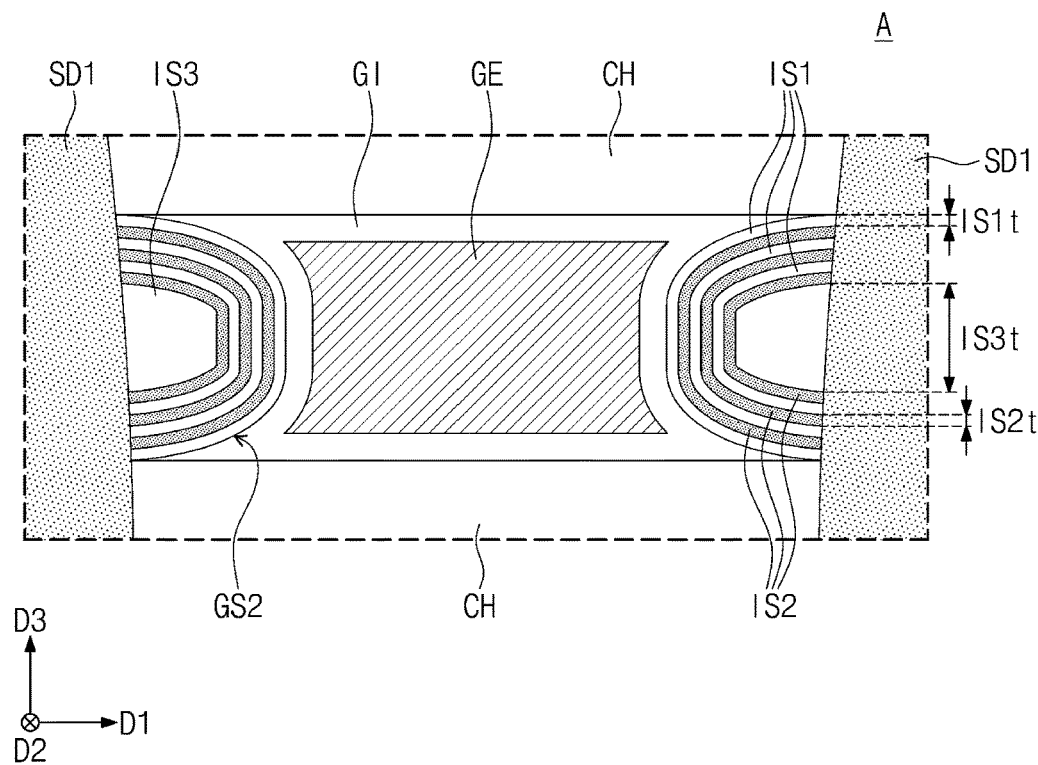
FIGS. 4 and 5 illustrate enlarged views of section A depicted in FIG. 2, showing a semiconductor device according to some example embodiments.

FIG. 4 illustrates an enlarged view of section A depicted in FIG. 2, showing a semiconductor device according to some example embodiments.

Referring to FIG. 4, the channel layers CH, the gate electrode GE between the channel layers CH, and the second gate spacers GS2 may be provided on opposite sides of the gate electrode GE. Each of the second gate spacers GS2 may include a plurality of layers that are sequentially stacked. For example, each of the second gate spacers GS2 may include a plurality of first spacer patterns IS1, a plurality of second spacer patterns IS2, and a single third spacer pattern IS3. The number of the first spacer patterns IS1 may be two or higher. The number of the second spacer patterns IS2 may be two or higher, and may be equal to the number of the first spacer patterns IS1. The second gate spacers GS2 including the plurality of first and second spacer patterns IS1 and IS2 may suppress or minimize undesired diffusion of impurities and increase in capacitance, and accordingly a semiconductor device according to example embodiments may improve in reliability and electrical characteristics.

Between the channel layers CH, the first spacer patterns IS1 and the second spacer patterns IS2 may be alternately and repeatedly stacked on the sidewall of the gate electrode GE. The first spacer patterns IS1 may correspondingly surround the second spacer patterns IS2. Each of the first and second spacer patterns IS1 and IS2 may be in contact with a sidewall of one of the first source/drain patterns SD1. The first spacer patterns IS1 and the second spacer patterns IS2 may be alternately and repeatedly stacked on sidewalls of the first source/drain patterns SD1. Each of the first and second spacer patterns IS1 and IS2 may have both end portions in contact with the sidewall of one of the first source/drain patterns SD1. An outermost one of the first and second spacer patterns IS1 and IS2 may be in contact with the gate dielectric pattern GI, and also with the channel layers CH that overlie and underlie the outermost pattern. It is illustrated that the outermost pattern is one of the first spacer patterns IS1, but example embodiments are not limited thereto, and the outermost pattern may be one of the second spacer patterns IS2.

The first and second spacer patterns IS1 and IS2 may extend along a sidewall of the gate dielectric pattern GI from a bottom surface of one of the channel layers CH. In addition, the first and second spacer patterns IS1 and IS2 may extend along a top surface of another of the channel layers CH from the sidewall of the gate dielectric pattern GI. For example, each of the first and second spacer patterns IS1 and IS2 may have a "C" shape in a cross-sectional view of the first direction D1.

According to some example embodiments, each of the first spacer patterns IS1 may have a thickness IS1$t$ equal to or greater than a thickness IS2$t$ of each of the second spacer patterns IS2. The thickness IS1$t$ of each of the first spacer patterns IS1 may range, for example, from about 1 nm to about 3 nm. The thickness IS2$t$ of each of the second spacer patterns IS2 may range, for example, from about 0.5 nm to about 1.5 nm. Each of the first spacer patterns IS1 may have an end portion in contact with one of the first source/drain patterns SD1, and the thickness IS1$t$ may be measured in the third direction D3 at the end portion of each of the first spacer patterns IS1. Likewise, each of the second spacer patterns IS2 may have an end portion in contact with one of the first source/drain patterns SD1, and the thickness IS2$t$ may be measured in the third direction D3 at the end portion of each of the second spacer patterns IS2.

The first spacer patterns IS1 may include the same material as that of the channel layers CH. The first spacer patterns IS1 may include, for example, one of silicon (Si), germanium (Ge), and silicon-germanium (SiGe). For example, the first spacer patterns IS1 may include silicon (Si). The second spacer patterns IS2 may include a different material from that of the first spacer patterns IS1. The second spacer patterns IS2 may include a dielectric material. The second spacer patterns IS2 may include, for example, silicon oxide.

The third spacer pattern IS3 may be surrounded by an innermost one of the second spacer patterns IS2. The third spacer pattern IS3 may be in contact with a sidewall of one of the first source/drain patterns SD1. The third spacer pattern IS3 may have a thickness IS3$t$ greater than the thickness IS1$t$ of each of the first spacer patterns IS1 and greater than the thickness IS2$t$ of each of the second spacer patterns IS2. The third spacer pattern IS3 may have a sidewall in contact with one of the first source/drain patterns SD1. For example, the third spacer IS3 may continuously contact one of the first source/drain patterns SD1 between ends of the innermost one of the second spacer patterns IS2. The thickness IS3$t$ may be measured in the third direction D3 at the sidewall of the third spacer pattern IS3. The third spacer pattern IS3 may include, for example, the same material as that of the first spacer patterns IS1.

As discussed above, according to some example embodiments, each of the second gate spacers GS2 may include a plurality of layers provided on the first source/drain patterns SD1 of the first cell region PR and/or on the second source/drain patterns SD2 of the second cell region NR. However, example embodiments are not limited thereto, and single-layer structured second gate spacers GS2 may be provided on the first source/drain patterns SD1 of the first cell region PR or on the second source/drain patterns SD2 of the second cell region NR.

Figure 5:
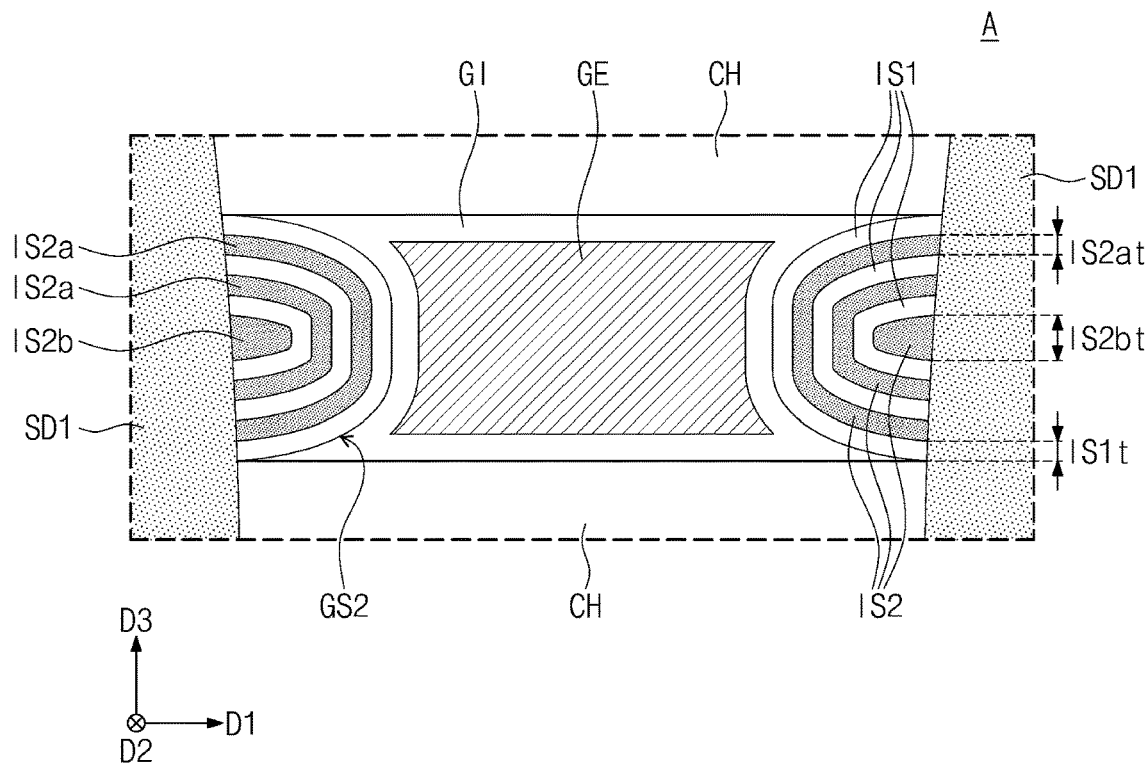

FIG. 5 illustrates an enlarged view of section A depicted in FIG. 2, showing a semiconductor device according to some example embodiments. For conciseness, the same technical features as those discussed above will not be repeated herein, and the following description will focus on differences.

Referring to FIG. 5, the second spacer patterns IS2 may include first parts IS2$a$, each of which has a "C" shape in a cross-sectional view of the first direction D1, and surrounds one of the first spacer patterns IS1, and a second part IS2$b$ surrounded by an innermost one of the first spacer patterns IS1. Each of the first parts may have both end portions in contact with a sidewall of one of the first source/drain patterns SD1. The second part IS2$b$ may have one sidewall in contact with that of one of the first source/drain patterns SD1. For example, the second part IS2$b$ may continuously contact one of the first source/drain patterns SD1 between ends of the innermost one of the first spacer patterns IS1.

The second part IS2$b$ may have a thickness IS2$bt$ greater than a thickness IS2$at$ of each of the first parts IS2$a$. For example, the thickness IS2$bt$ of the second part IS2$b$ may be about 1.5 times to about 2 times the thickness IS2$at$ of each of the first parts IS2$a$.

Figure 6:
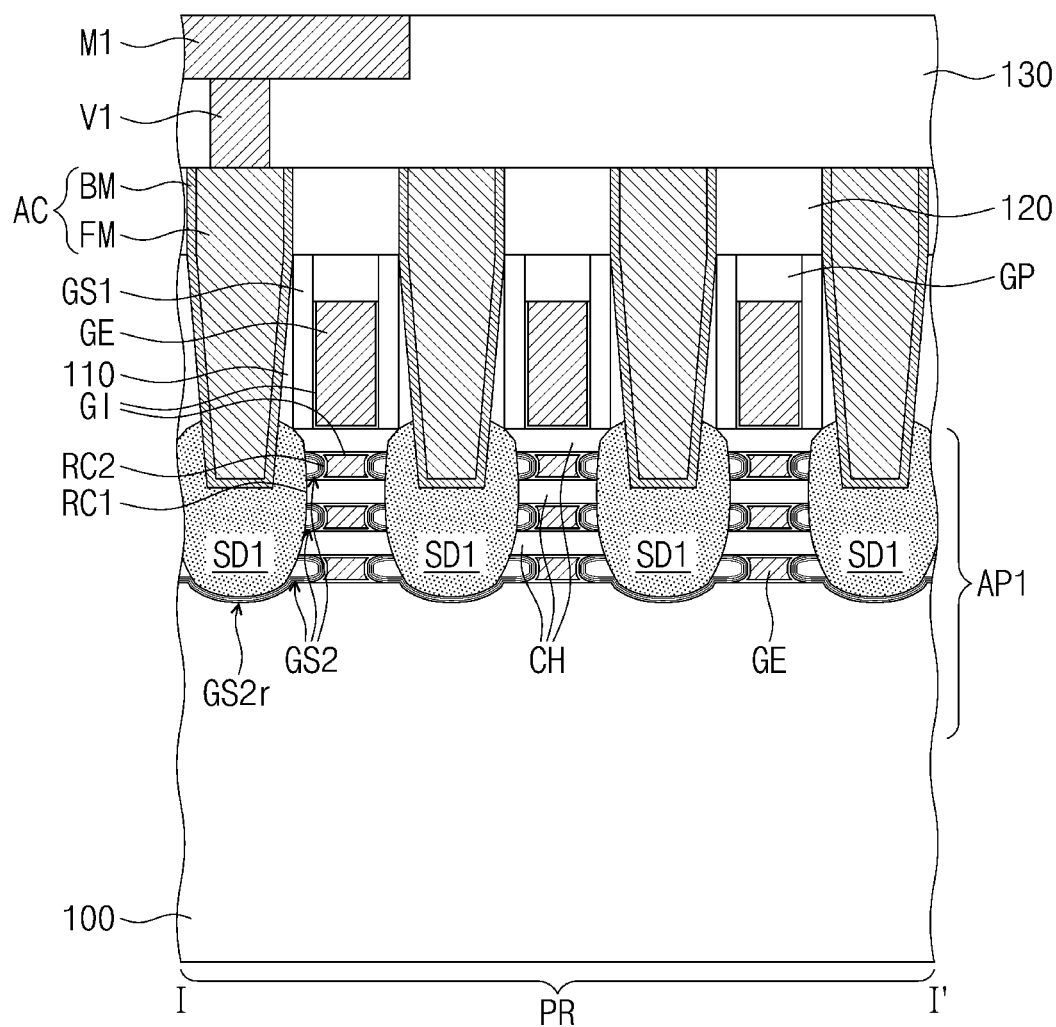
FIG. 6 illustrates a cross-sectional view taken along line I-I' of FIG. 1, showing a semiconductor device according to some example embodiments.

FIG. 6 illustrates a cross-sectional view taken along line I-I' of FIG. 1, showing a semiconductor device according to some example embodiments. For conciseness, the same technical features as those discussed above will not be repeated herein, and the following description will focus on differences.

Referring to FIGS. 1, 3, and 6, lowermost ones of the second gate spacers GS2 may extend onto a bottom surface of the first source/drain patterns SD1. Referring back to FIG. 4, the first and second spacer patterns IS1 and IS2 of each of the second gate spacers GS2 may extend onto a bottom surface of one of the first source/drain patterns SD1. A residual gate spacer GS2$r$ may indicate a portion of each of the second gate spacers GS2 provided below the first source/drain patterns SD1. The residual gate spacer GS2$r$ may overlap, in the third direction D3, with the first source/drain patterns SD1 and the active contacts AC. The first source/drain patterns SD1 may be spaced apart from the substrate 100 in the third direction D3 by the residual gate spacer GS2$r$.

As the residual gate spacer GS2$r$ is provided below each of the first source/drain patterns SD1, a leakage current from the first source/drain patterns SD1 toward the substrate 100 may be reduced without affecting epitaxial growth of the first source/drain patterns SD1 during fabrication process, which may result in an improvement in reliability and electrical characteristics of semiconductor devices consistent with example embodiments.

FIGS. 7A, 8A, 10A, 14A, and 16A illustrate plan views showing a method of fabricating a semiconductor device according to some example embodiments. FIGS. 7B, 8B, 9, 10B, 11, 12, 13, 14B, 15A, and 16B illustrate cross-sectional views taken along line I-I' of FIGS. 7A, 8A, 10A, 14A, and 16A, showing a method of fabricating a semiconductor device according to some example embodiments. FIGS. 7C, 8C, 15B, and 16C illustrate cross-sectional views taken along line II-II' of FIGS. 7A, 8A, 14A, and 16A, showing a method of fabricating a semiconductor device according to some example embodiments.

With reference to FIGS. 7A to 16C, the following will describe in detail methods of fabricating semiconductor devices according to some example embodiments.

Figure 7A:
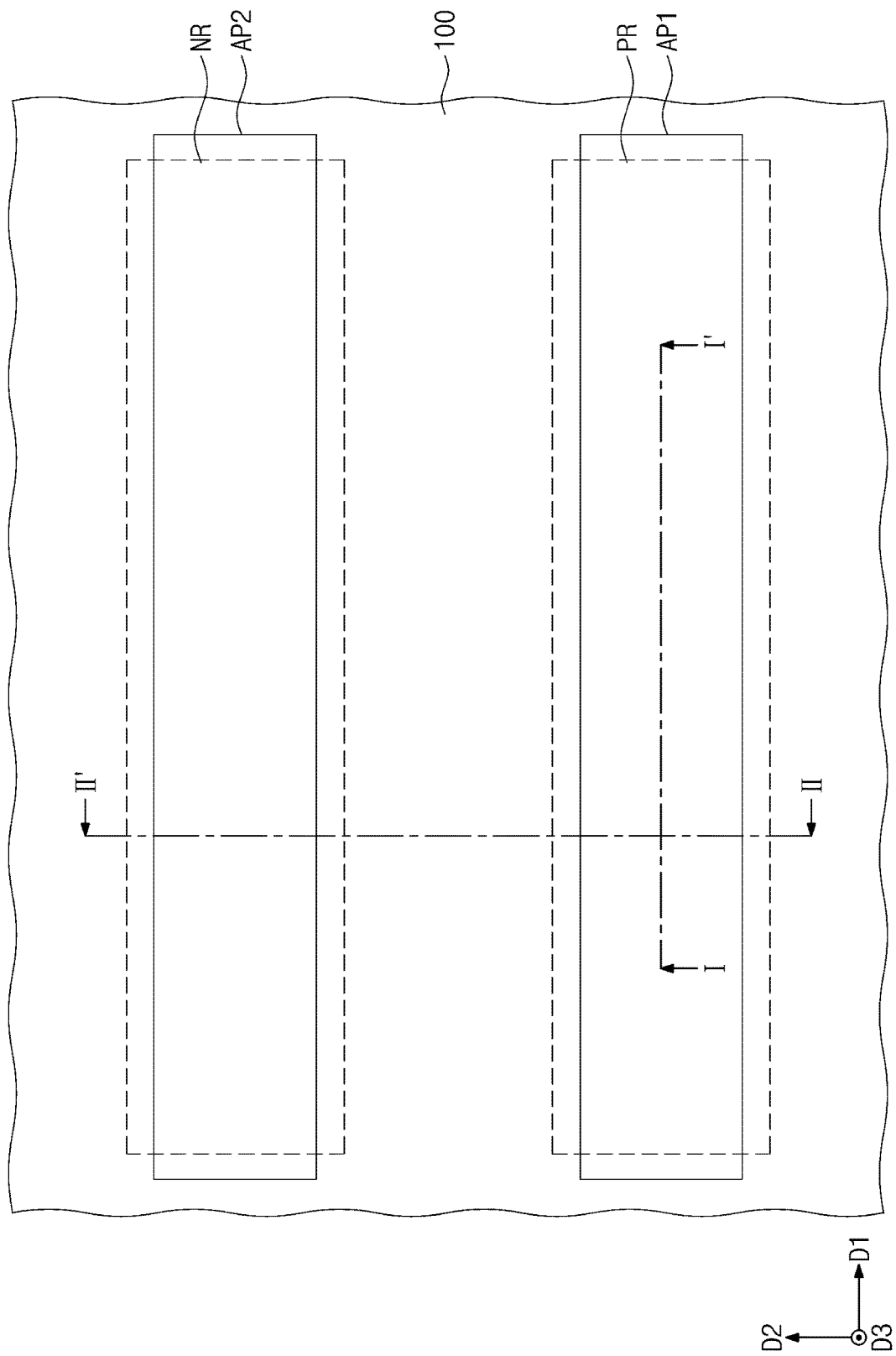
Figure 7B:
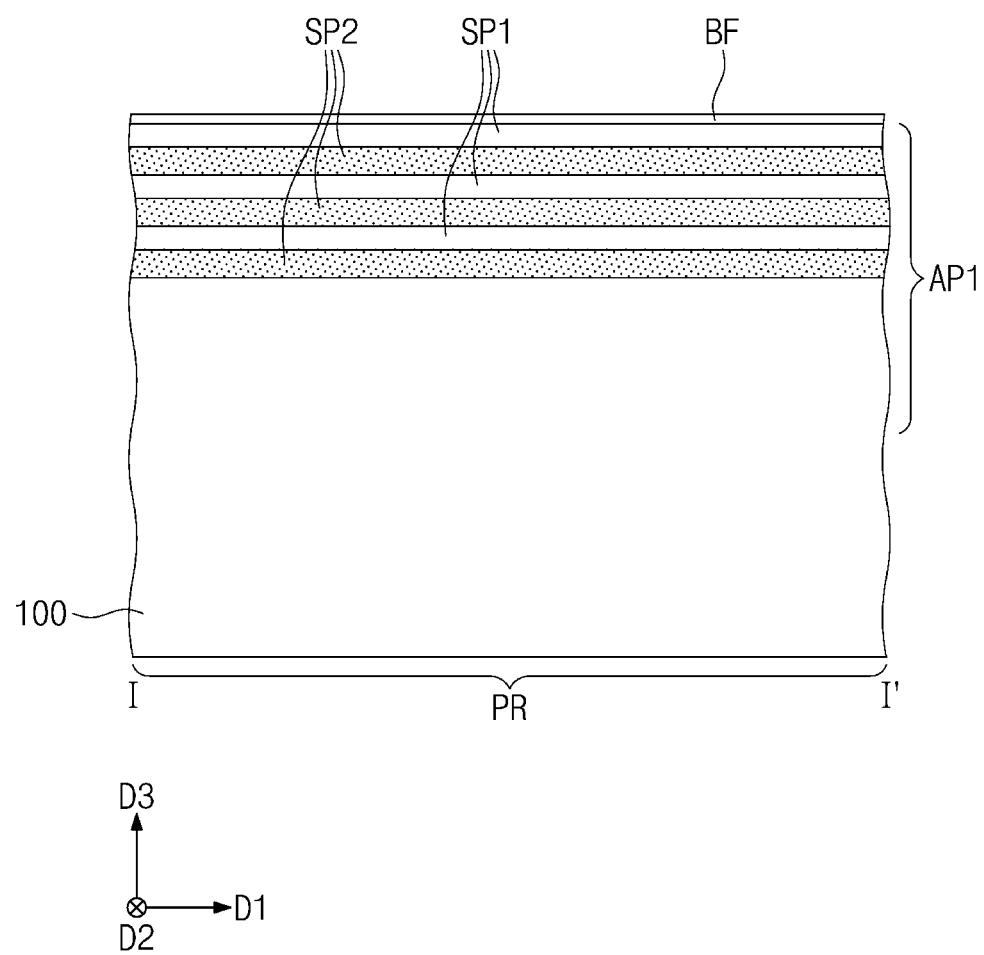
FIGS. 7B, 8B, 9, 10B, 11, 12, 13, 14B, 15A, and 16B illustrate cross-sectional views taken along line I-I' of FIGS. 7A, 8A, 10A, 14A, and 16A, showing a method of fabricating a semiconductor device according to some example embodiments.
Figure 7C:
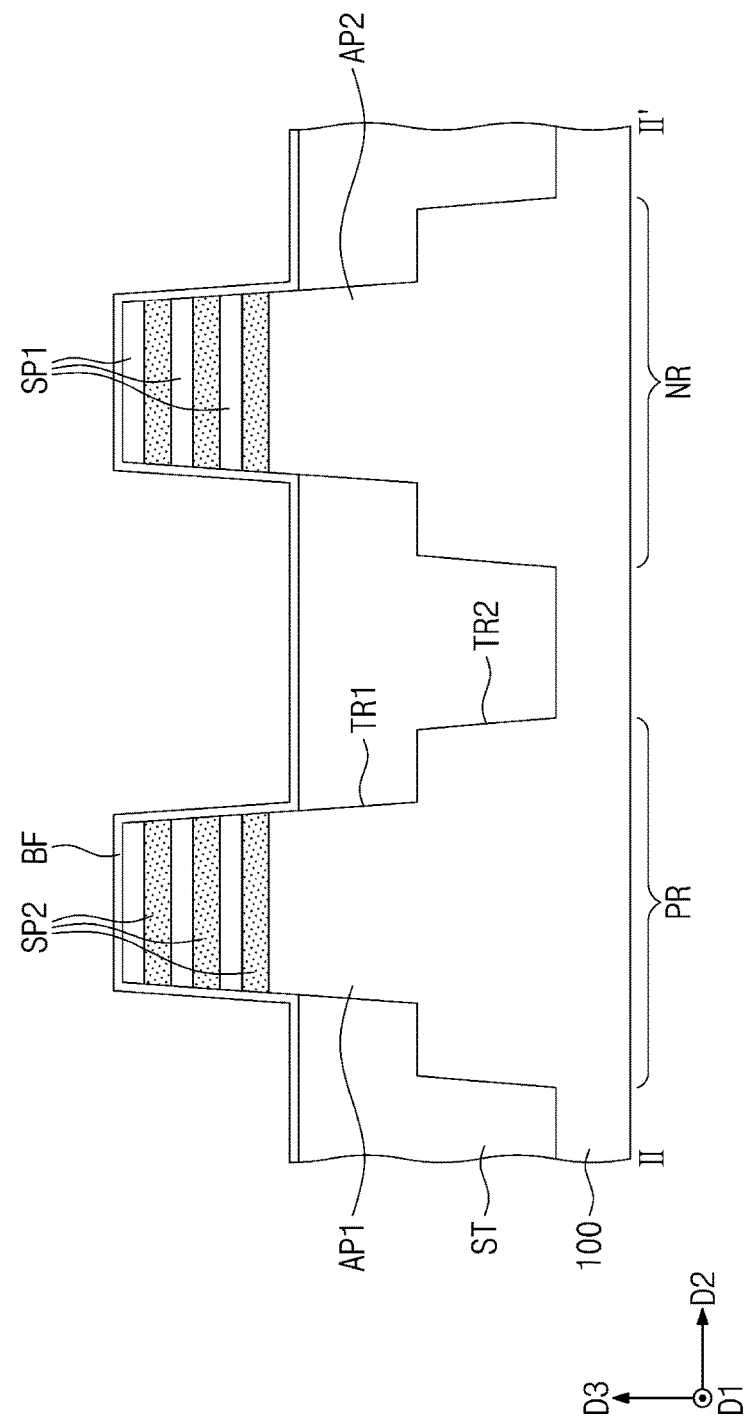
FIGS. 7C, 8C, 15B, and 16C illustrate cross-sectional views taken along line II-II' of FIGS. 7A, 8A, 14A, and 16A, showing a method of fabricating a semiconductor device according to some example embodiments.

Referring to FIGS. 7A, 7B, and 7C, a substrate 100 may be provided which has a flat plate shape that extends in a first direction D1 and a second direction D2 and which includes a semiconductor material. First and second semiconductor layers may be formed which are alternately and repeatedly stacked on the substrate 100. The first semiconductor layers may include one of silicon (Si), germanium (Ge), and silicon-germanium (SiGe), and the second semiconductor layer may include another of silicon (Si), germanium (Ge), and silicon-germanium (SiGe). For example, the first semiconductor layers may include silicon (Si), and second semiconductor layers may include silicon-germanium (SiGe).

The substrate 100 may undergo a first patterning process to form a first trench TR1 that defines a first active pattern AP1 and a second active pattern AP2. During the first patterning process, the first semiconductor layers and the second semiconductor layers may be patterned to respectively form first semiconductor patterns SP1 and second semiconductor patterns SP2. The first and second semiconductor patterns SP1 and SP2 may be alternately and repeatedly stacked on each of the first and second active patterns AP1 and AP2.

The substrate 100 may undergo a second patterning process to form a second trench TR2 that defines a first cell region PR and a second cell region NR. The second trench TR2 may be formed deeper than the first trench TR1. The first and second active patterns AP1 and AP2 may be respectively formed on the first and second cell regions PR and NR.

A device isolation layer ST may be formed on the substrate 100 in (and for example may fill) the first and second trenches TR1 and TR2. The device isolation layer ST may include a dielectric material, such as silicon oxide. The device isolation layer ST may be recessed until upper portions of the first and second active patterns AP1 and AP2 are exposed. The first and second active patterns AP1 and AP2 may have upper portions that vertically protrude upward in a third direction D3 from the device isolation layer ST.

A buffer layer BF may be formed on the upper portions of the first and second active patterns AP1 and AP2, which upper portions protrude upward from the device isolation layer ST. The buffer layer BF may extend onto a top surface of the device isolation layer ST. The buffer layer BF may include, for example, silicon oxide.

Figure 8B:
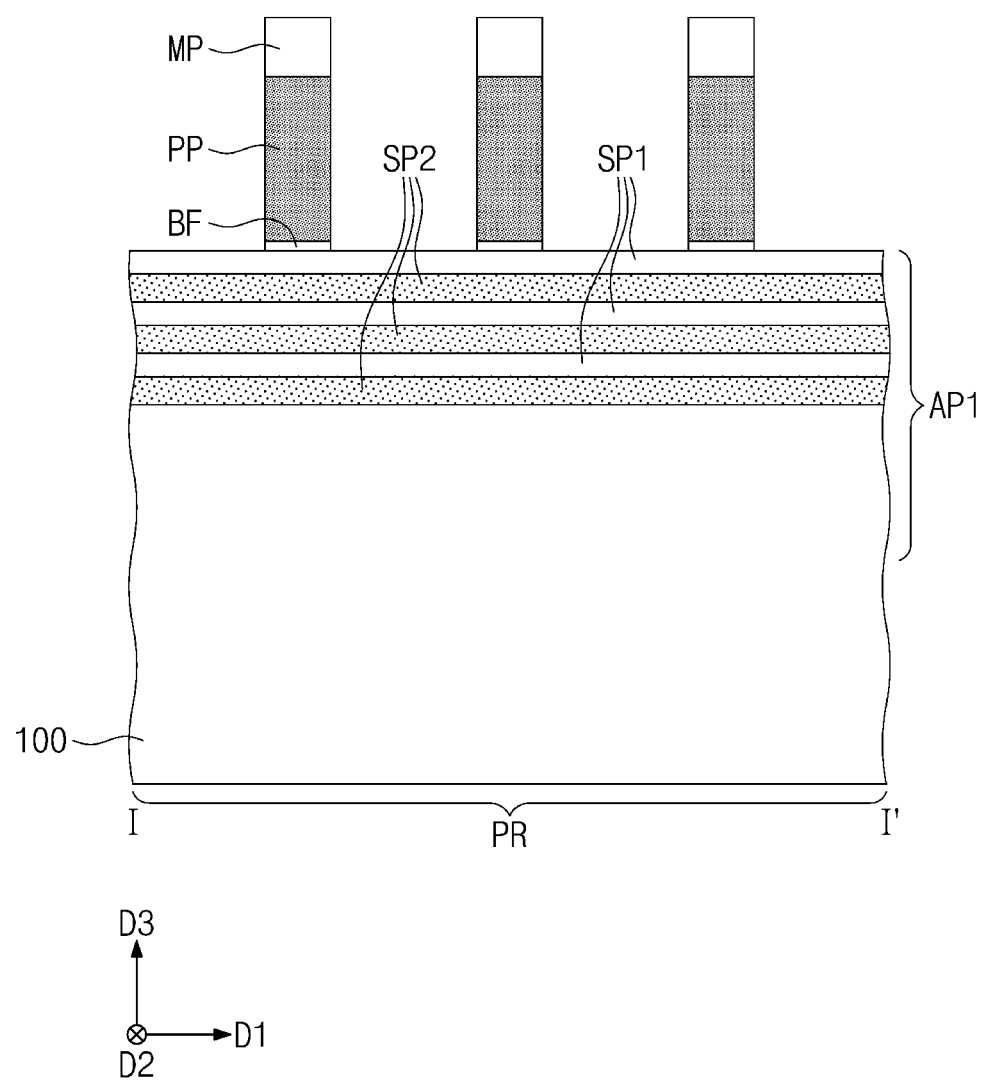
Figure 8C:
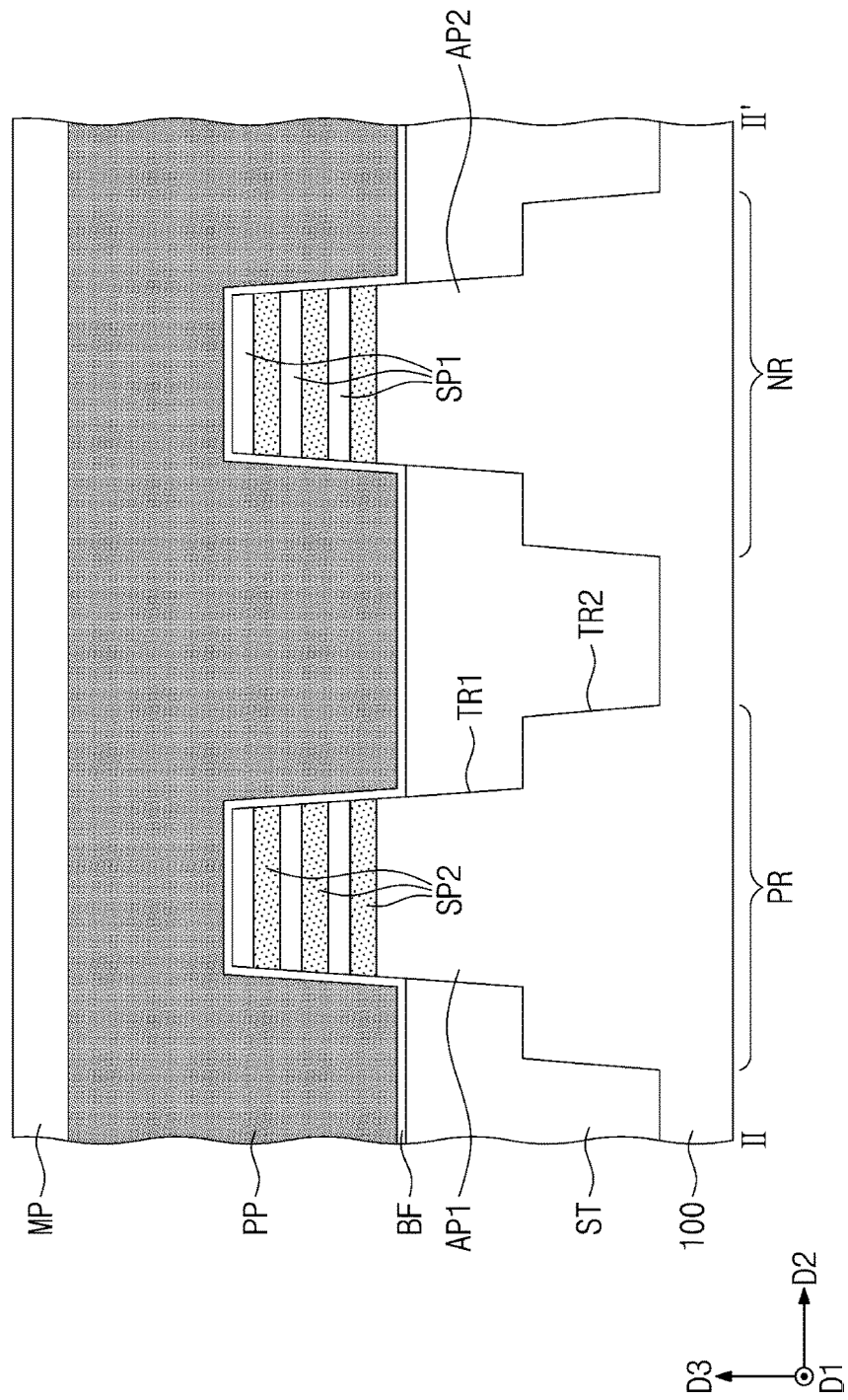

Referring to FIGS. 8A, 8B, and 8C, a sacrificial pattern PP may be formed on the first and second active patterns AP1 and AP2. The sacrificial pattern PP may be provided in plural. The plurality of sacrificial patterns PP may be spaced apart from each other in the first direction D1. Although a single sacrificial pattern PP is described below for the purpose of convenience, this description will be applied substantially identically to other sacrificial patterns PP. The sacrificial pattern PP may be formed to have a linear or bar shape that extends in the second direction D2.

For example, the formation of the sacrificial pattern PP may include forming a sacrificial layer on an entire surface of the substrate 100, forming a hardmask pattern MP on the sacrificial layer, and using the hardmask pattern MP as an etching mask to pattern the sacrificial layer and the buffer layer BF. The sacrificial layer may include, for example, polysilicon. The hardmask pattern MP may include, for example, silicon nitride.

Figure 9:
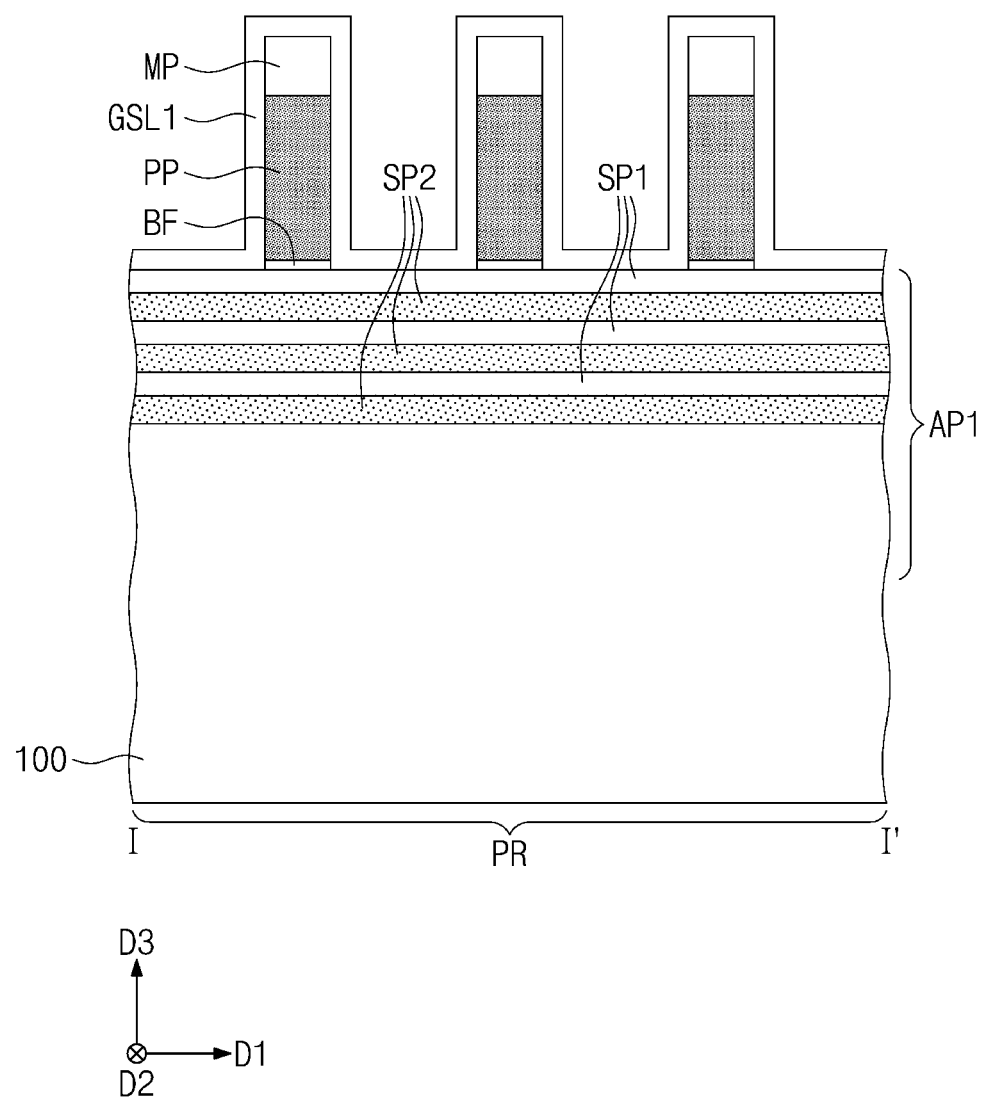

Referring to FIG. 9, a first gate spacer layer GSL1 may be formed on a top surface of an uppermost one of the first semiconductor patterns SP1, a top surface and sidewalls of the hardmask pattern MP, sidewalls of the sacrificial pattern PP, and sidewalls of the buffer layer BF. The first gate spacer layer GSL1 may be formed of, for example, silicon nitride.

Figure 10A:
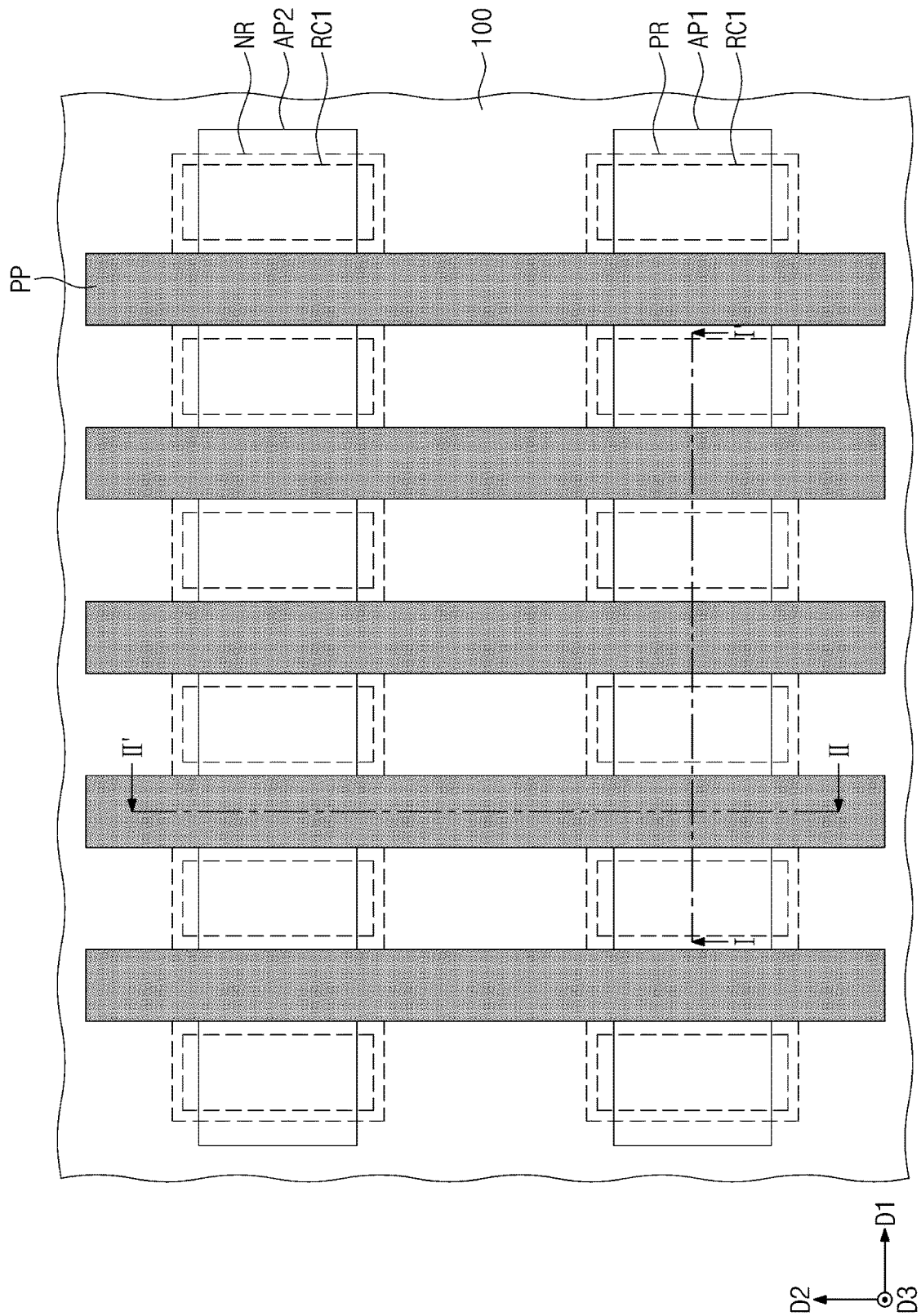
Figure 10B:
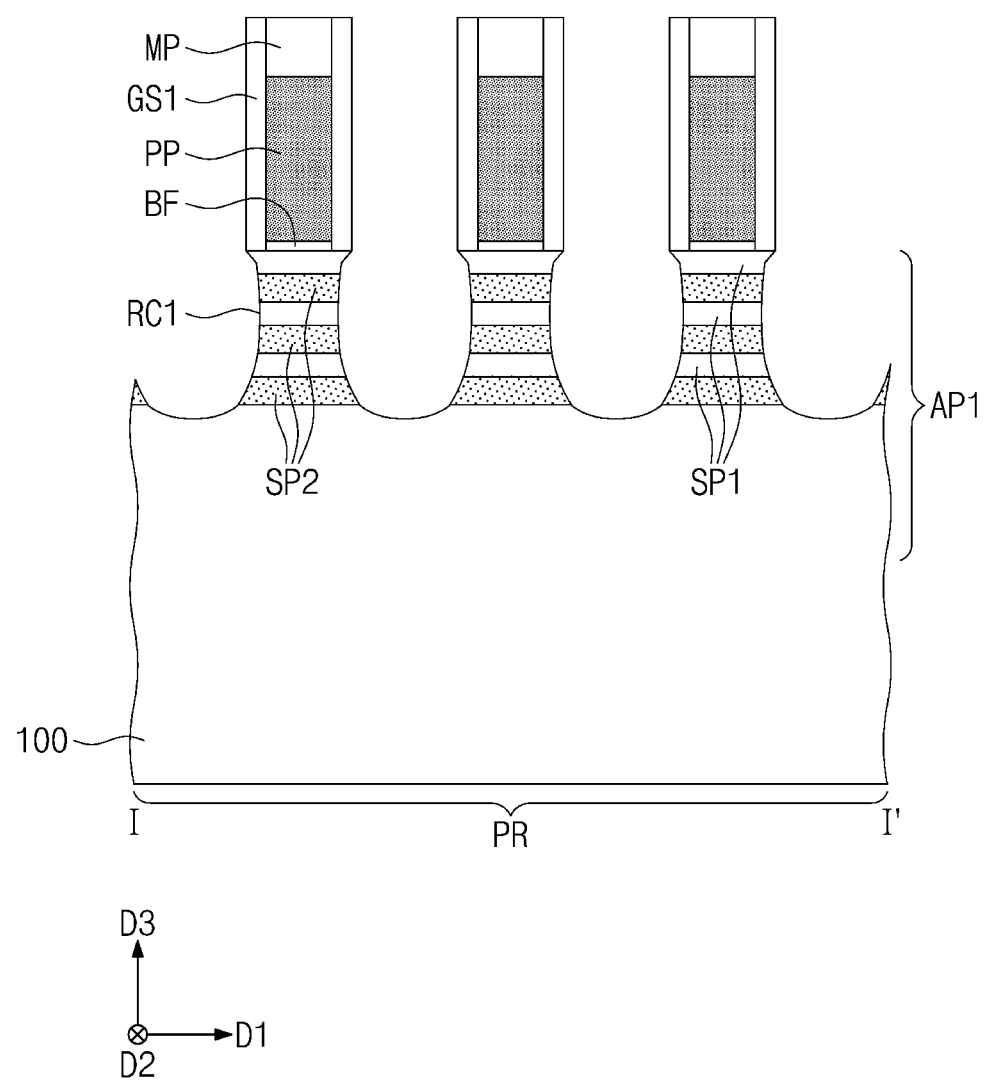

Referring to FIGS. 10A and 10B together with FIG. 9, the first gate spacer layer GSL1 may be removed from the top surface of the uppermost first semiconductor pattern SP1 and the top surface of the hardmask pattern MP, and thus first gate spacers GS1 may be formed on opposite sidewalls of the sacrificial pattern PP.

The first active pattern AP1 may be partially recessed to form first recessions RC1. The first recessions RC1 may be formed on opposite sides of the sacrificial pattern PP. The first recessions RC1 may be formed by using the hardmask pattern MP and the first gate spacers GS1 as an etching mask to etch an upper portion of the first active pattern AP1.

Figure 11:
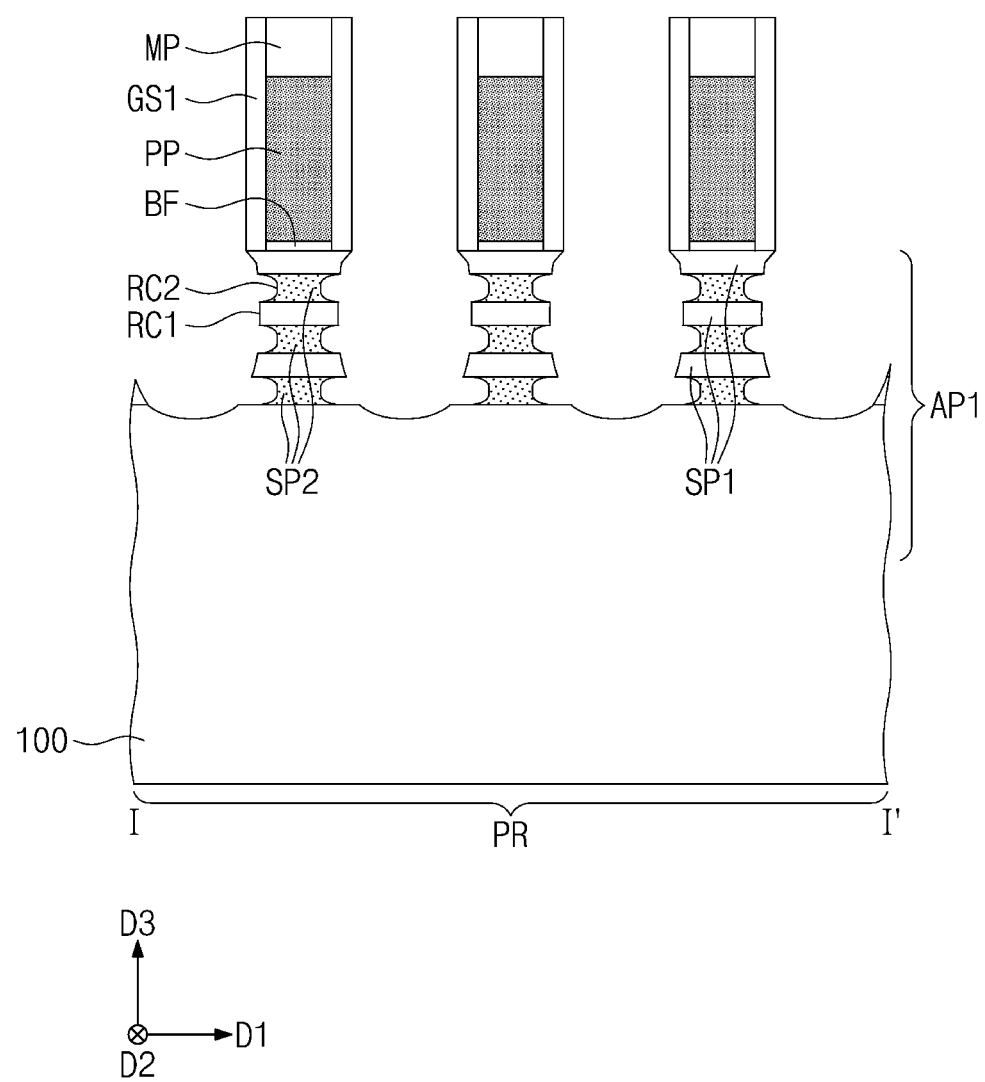

Referring to FIG. 11, each of the second semiconductor patterns SP2 exposed to the first recessions RC1 may be recessed in the first direction D1 to form second recessions RC2. During the formation of the second recessions RC2, the first semiconductor patterns SP1 exposed to the first recessions RC1 may not be removed. Each of sidewalls of the second semiconductor patterns SP2 exposed to the second recessions RC2 may have a C-shaped curved surface.

Figure 12:
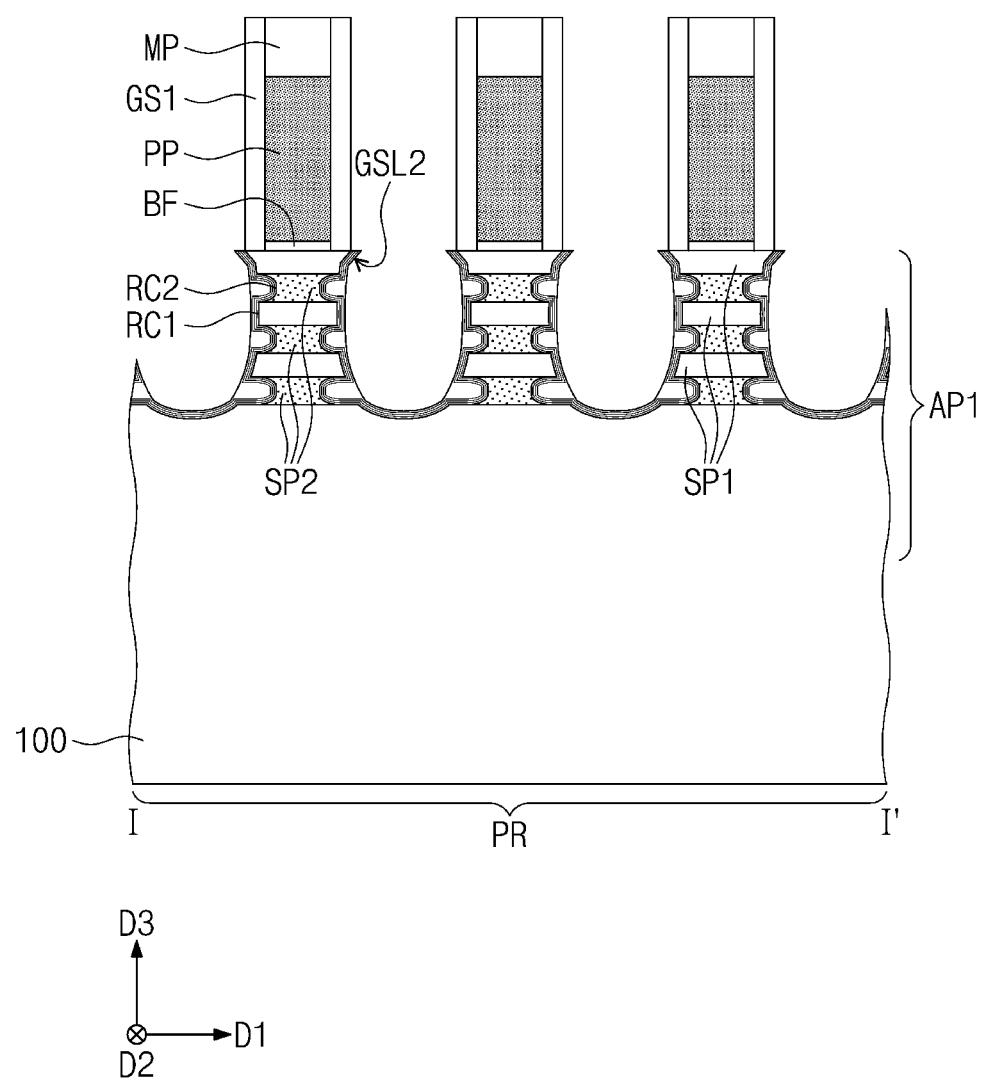

Referring to FIG. 12, a second gate spacer layer GSL2 may be formed on inner walls of the first and second recessions RC1 and RC2. The formation of the second gate spacer layer GSL2 may include alternately and repeatedly forming two types of layers including different materials from each other. The second gate spacer layer GSL2 may include, for example, semiconductor layers and dielectric layers that are alternately and repeatedly stacked.

Figure 13:
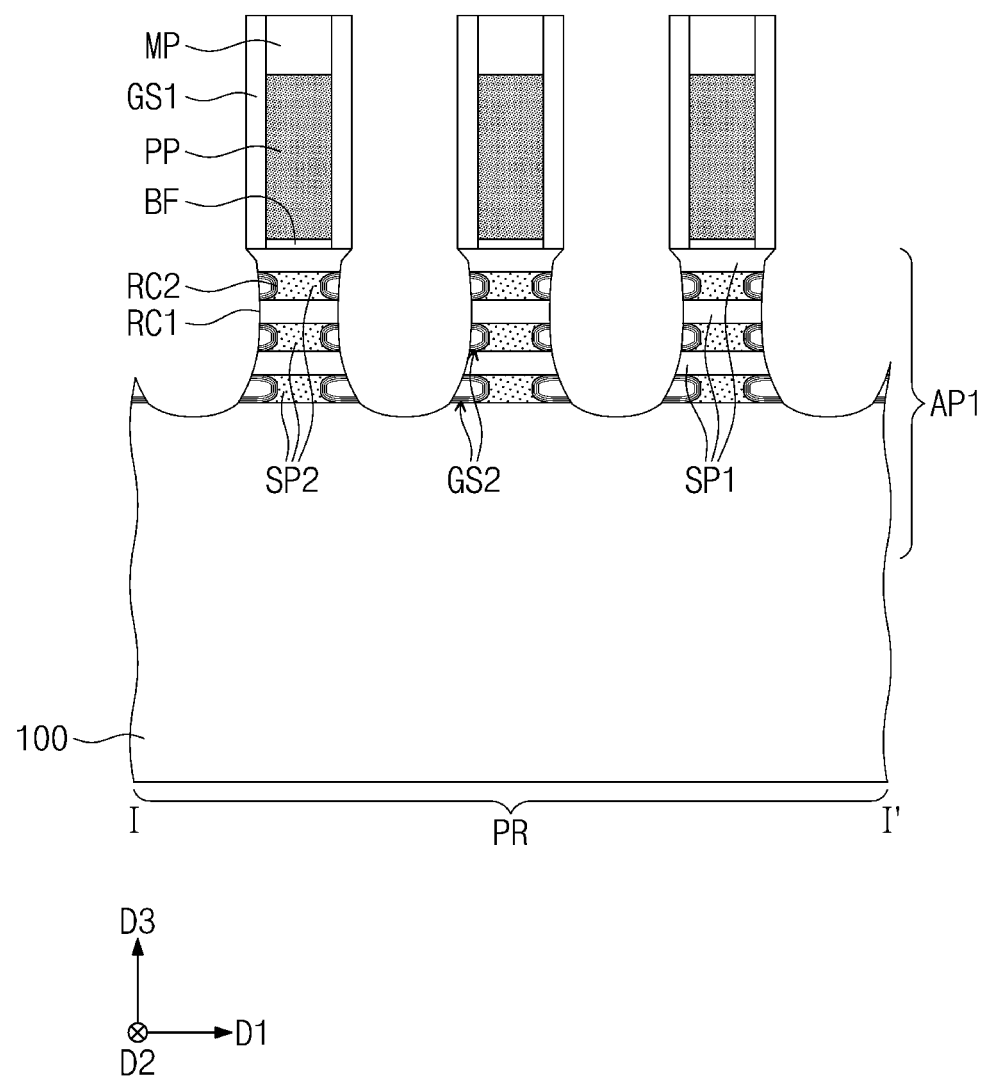

Referring to FIG. 13 together with FIG. 12, each of the semiconductor and dielectric layers formed within the first recessions RC1 may be partially removed, and semiconductor patterns and dielectric patterns formed within the second recessions RC2 may not be removed. As a result, second gate spacers GS2 may be formed which include the semiconductor patterns and the dielectric patterns that remain within the second recessions RC2. The semiconductor patterns may correspond to the first spacer patterns IS1 discussed with reference to FIG. 4 or 5, and the dielectric patterns may correspond to the second spacer patterns IS2 discussed with reference to FIG. 4 or 5.

According to some example embodiments, when removing a portion of each of the semiconductor and dielectric layers that are formed within the first recessions RC1, the semiconductor layers and the dielectric layer may remain on a bottom surface of each of the first recessions RC1, and thus a residual gate spacer GS2r may be formed as discussed with reference to FIG. 6.

Figure 14A:
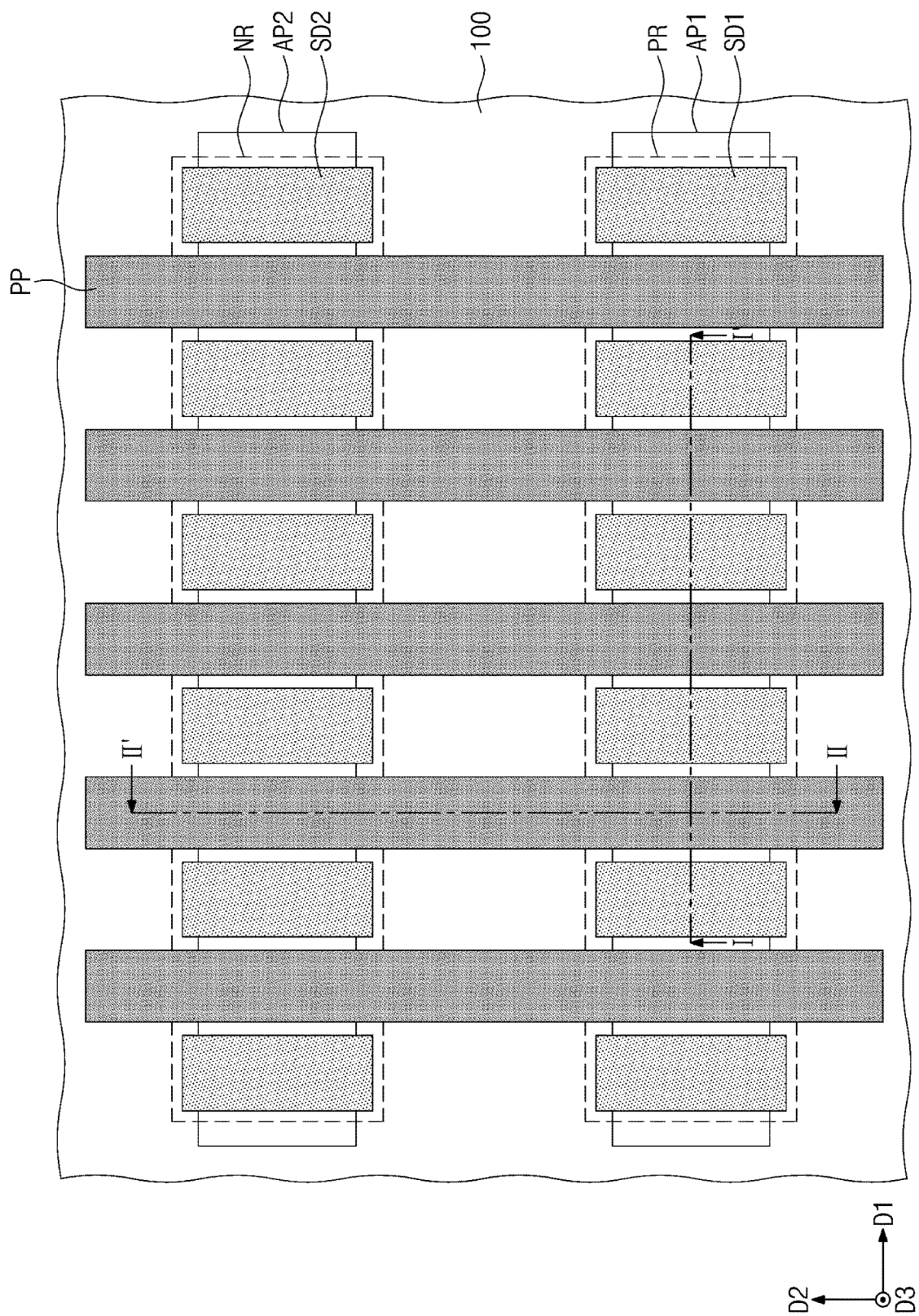
Figure 14B:
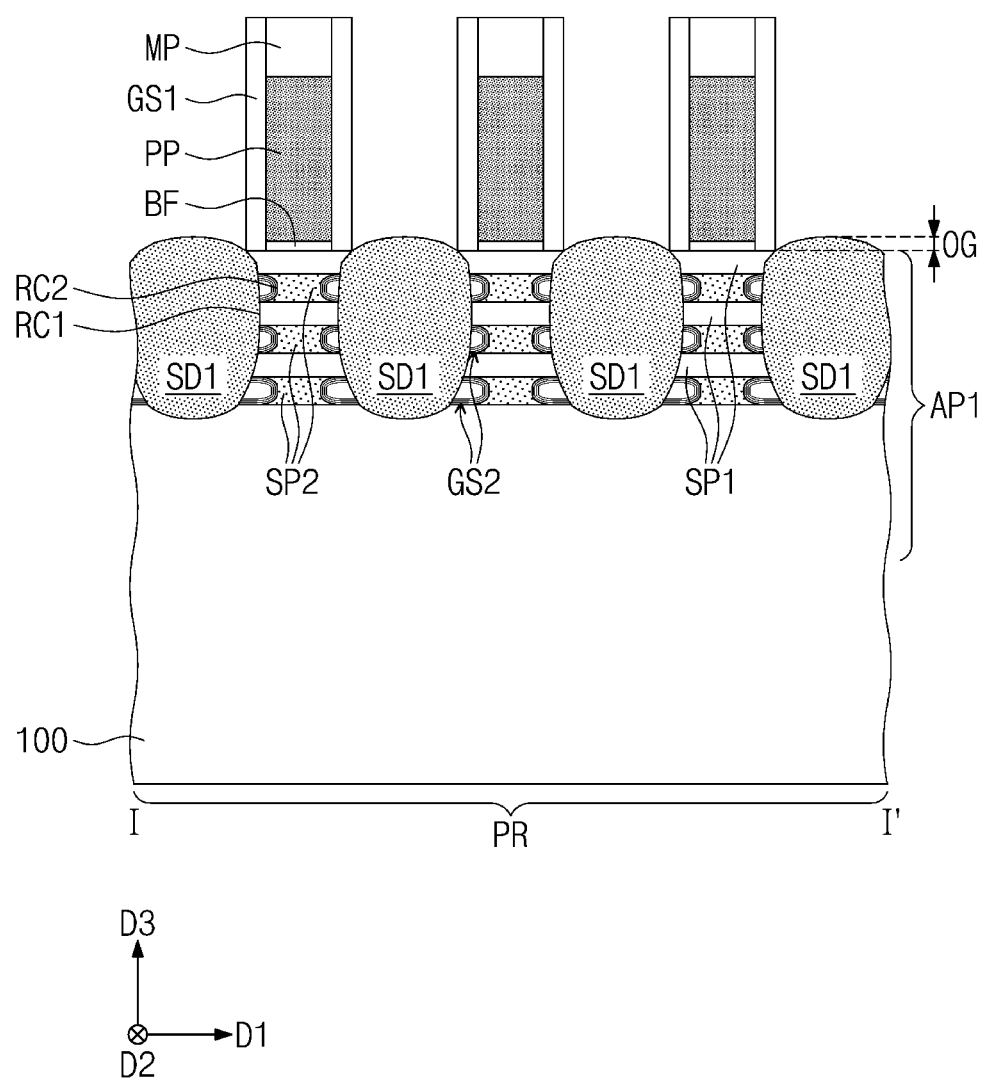

Referring to FIGS. 14A and 14B, first source/drain patterns SD1 may be formed in the first recessions RC1 formed on the upper portion of the first active pattern AP1. A pair of first source/drain patterns SD1 may be formed on opposite sides of the sacrificial pattern PP. Each of the first source/drain patterns SD1 may have a top surface located at a higher level than that of the top surface of the uppermost first semiconductor pattern SP1. A level difference OG between the top surface of each first source/drain pattern SD1 and the top surface of the uppermost first semiconductor pattern SP1 may range from about 1 nm to about 10 nm.

The first source/drain patterns SD1 may be formed by a selective epitaxial growth process in which a top surface of the first active pattern AP1 exposed to the first recessions RC1 is used as a seed, and in which inner walls of the first recessions RC1 are also used as seeds. For example, the first source/drain patterns SD1 may be formed by a selective epitaxial growth process in which sidewalls of the first semiconductor patterns SP1 exposed to the first recessions RC1 are used as seeds, and in which sidewalls of the second gate spacers GS2 exposed to the first recessions RC1 are also used as seeds. Therefore, it may be possible to reduce a variation in level of top surfaces of the first source/drain patterns SD1 and to improve reliability and electrical characteristics of semiconductor devices consistent with example embodiments.

For example, impurities may be in-situ implanted during the selective epitaxial growth process for forming the first source/drain patterns SD1. For another example, impurities may be implanted after the formation of the first source/drain patterns SD1.

Figure 15A:
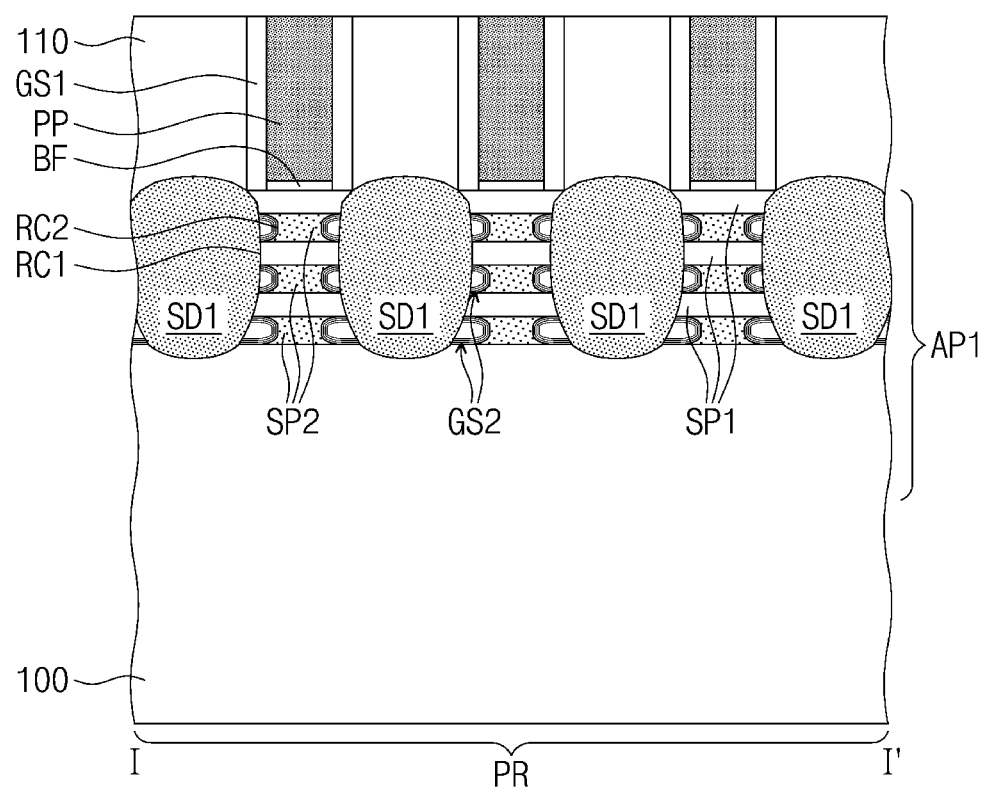
Figure 15B:
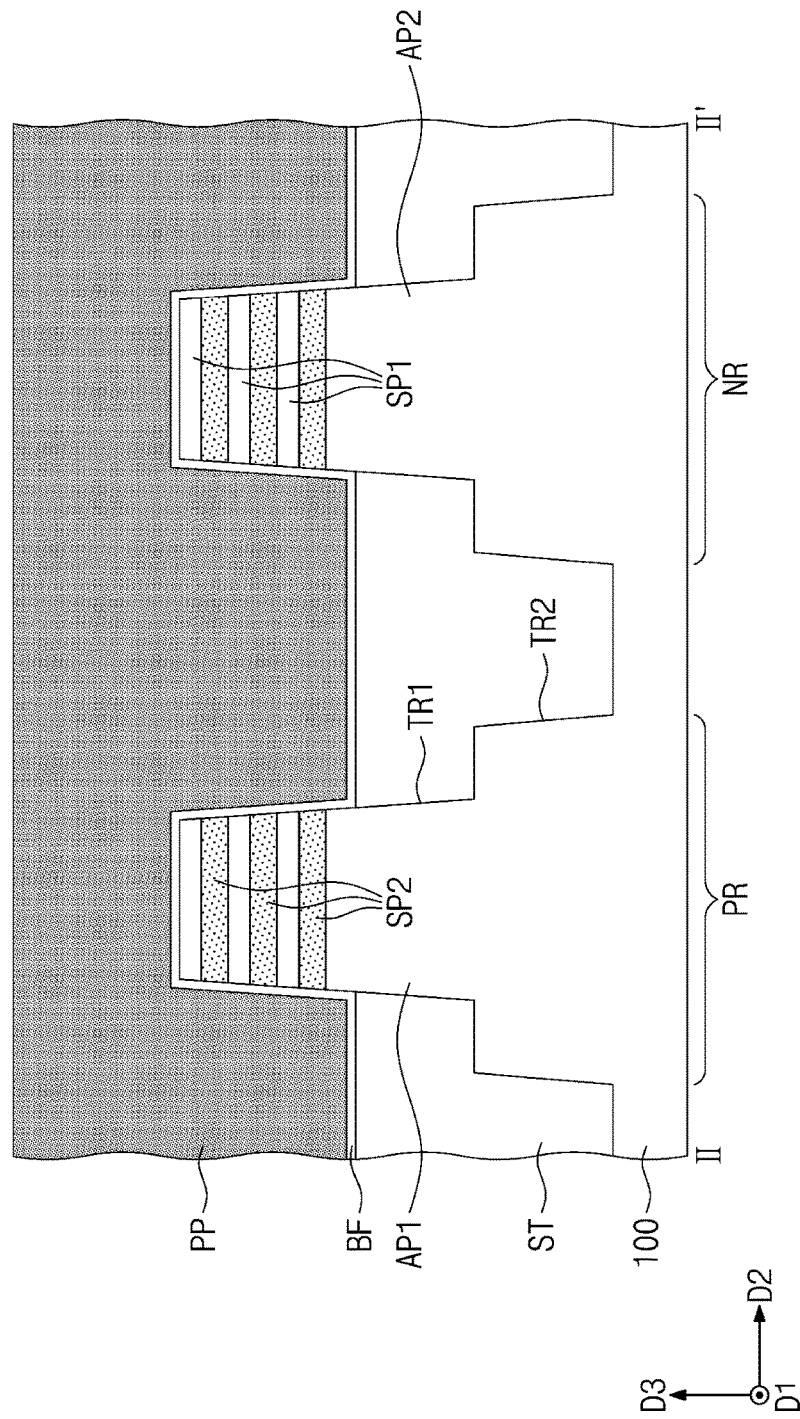

Referring to FIGS. 15A and 15B together with FIGS. 14A and 14B, a first interlayer dielectric layer 110 may be formed on sidewalls of the first gate spacers GS1 and top surfaces of the first source/drain patterns SD1. The first interlayer dielectric layer 110 may not be provided on a top surface of the first active pattern AP1. For example, the first interlayer dielectric layer 110 may not be provided on a top surface of the first gate spacers GS1 and may not be provided on a top surface of the mask pattern MP. A planarization process may be performed to remove the hardmask pattern MP on the sacrificial pattern PP. The planarization process may be, for example, an etch-back process or a chemical mechanical polishing (CMP) process. The planarization process may remove a portion of the first interlayer dielectric layer 110. The first interlayer dielectric layer 110 may have a top surface substantially coplanar with those of the first gate spacers GS1 and that of the sacrificial pattern PP.

Figure 16A:
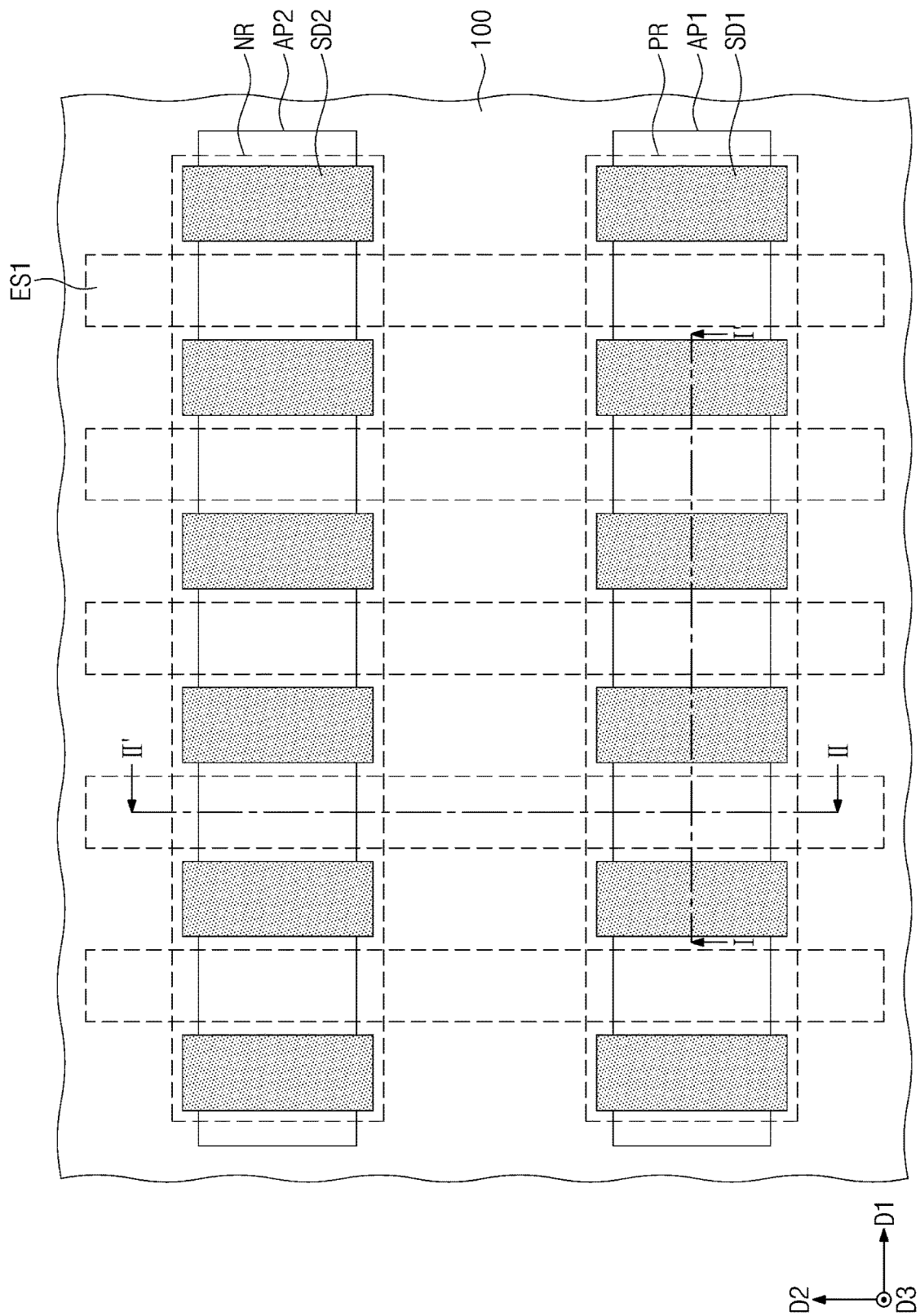
Figure 16B:
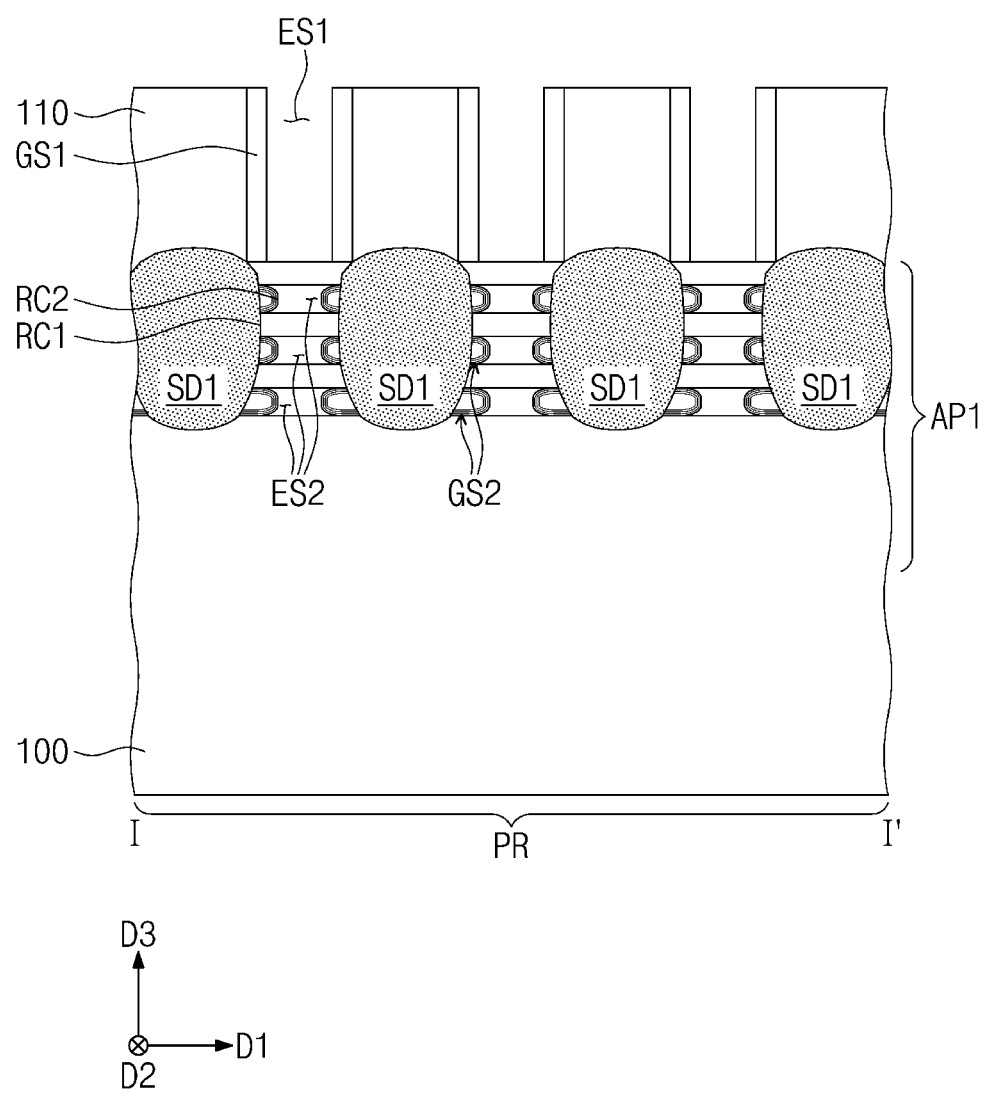
Figure 16C:
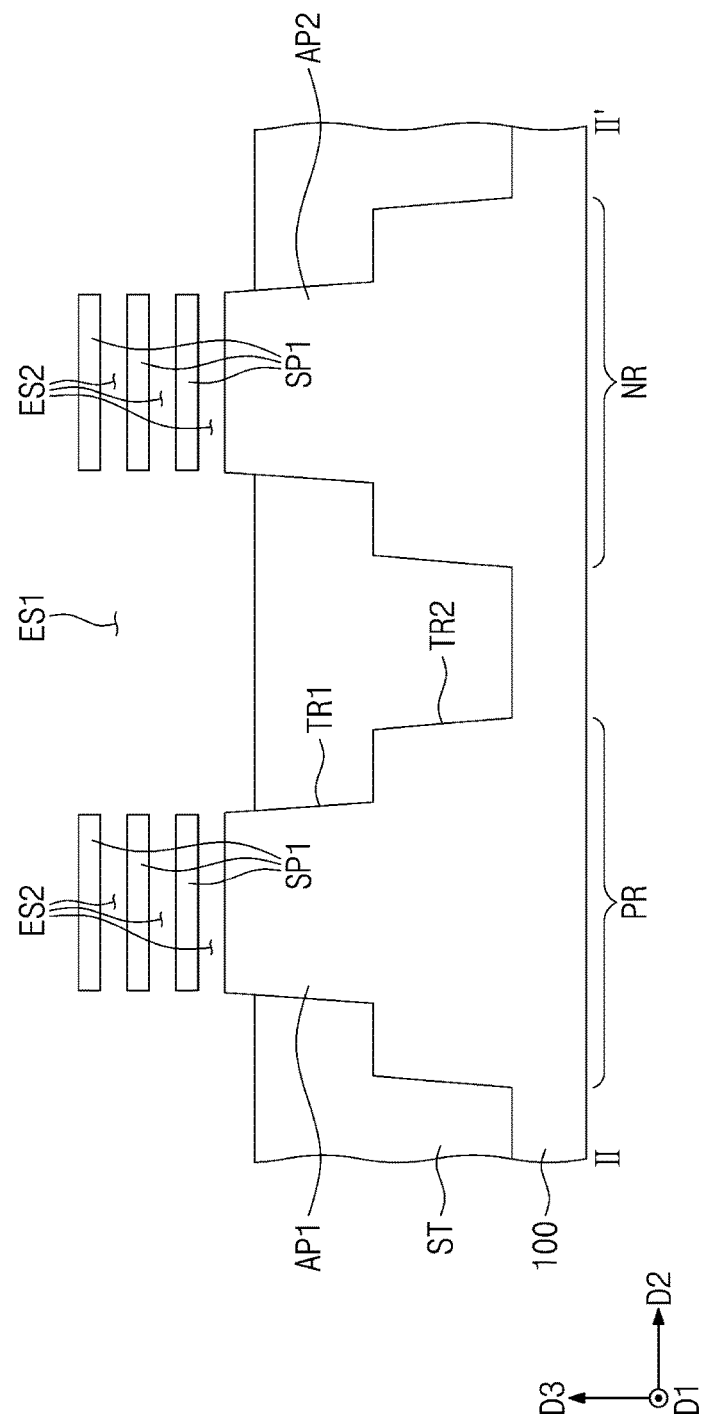

Referring to FIGS. 16A, 16B, and 16C together with FIGS. 15A and 15B, the sacrificial pattern PP may be selectively removed. The removal of the sacrificial pattern PP may form a first empty space ES1 that exposes the first active pattern AP1.

Afterwards, the second semiconductor patterns SP2 may be selectively removed. The first empty space ES1 may expose the second semiconductor patterns SP2. The second semiconductor patterns SP2 may be selectively removed by an etching process due to the second semiconductor patterns SP2 having high etch selectivity with respect to the first semiconductor patterns SP1. After the etching process is performed on the second semiconductor patterns SP2, the first semiconductor patterns SP1 may remain without being removed. After the etching process is performed on the second semiconductor patterns SP2, the first and second gate spacers GS1 and GS2 may also remain without being removed. The removal of the second semiconductor patterns SP2 may form second empty spaces ES2. Each of the second empty spaces ES2 may be defined to refer to a gap between the first semiconductor patterns SP1 that are adjacent to each other in the third direction D3.

Referring back to FIGS. 1, 2, and 3, a gate electrode GE may be formed in the first and second empty spaces ES1 and ES2. Before the gate electrode GE is formed, a gate dielectric pattern GI may be conformally formed on sidewalls, top, and bottom surfaces of the first and second empty spaces ES1 and ES2. The first semiconductor patterns SP1 may be referred to as channel layers CH.

Thereafter, a gate capping pattern GP may be formed on the gate electrode GE. The formation of the gate capping pattern GP may include partially recessing the gate electrode GE that is provided in the first empty space ES1, forming a capping layer that is provided in, and for example may fill a hollow area where the gate electrode GE is recessed, and performing a planarization process to remove a portion of the capping layer. The gate capping pattern GP may be formed of, for example, silicon nitride. The gate capping pattern GP may have a top surface substantially coplanar with those of the first gate spacers GS1.

A second interlayer dielectric layer 120 may be formed to on the top surface of the first interlayer dielectric layer 110 and the top surface of the gate capping pattern GP. Active contacts AC may be formed to penetrate the first and second interlayer dielectric layers 110 and 120 and to electrically connect with the first source/drain patterns SD1. A gate contact GC may be formed to penetrate the second interlayer dielectric layer 120 and the gate capping pattern GP and to electrically connect with the gate electrode GE.

A third interlayer dielectric layer 130 may be formed on the active contacts AC and the gate contact GC. A first metal layer may be formed in the third interlayer dielectric layer 130, and the first metal layer may include first wiring lines M1, a first via V1, and a second via V2. Additional metal layers (e.g., M2, M3, M4, etc.) may further be provided on the third interlayer dielectric layer 130.

According to semiconductor devices and fabrication methods in accordance with some example embodiments, a source/drain pattern may be formed through a selective epitaxial growth process in which sidewalls of semiconductor patterns exposed to a recession are used as seeds, and in which sidewalls of gate spacers exposed to the recession are also used as seeds, and therefore it may be possible to reduce a variation in level of top surfaces of the source/drain patterns. In addition, the gate spacers each including a plurality of layers may suppress or minimize undesired diffusion of impurities and increase in capacitance. Accordingly, the semiconductor device may improve in reliability and electrical characteristics.

While aspects of example embodiments have been particularly shown and described, it will be understood that various changes in form and details may be made therein without departing from the spirit and scope of the following claims.

What is claimed is:

1. A semiconductor device, comprising:
   an active pattern provided on a substrate and extending in a first direction;
   a pair of source/drain patterns provided on the active pattern and spaced apart from each other in the first direction;
   a plurality of channel layers vertically stacked and spaced apart from each other on the active pattern between the pair of source/drain patterns;
   a gate electrode extending in a second direction between the pair of source/drain patterns, the gate electrode being provided on the active pattern and surrounding the plurality of channel layers, and the second direction intersecting the first direction; and
   a gate spacer provided between the plurality of channel layers, and between the gate electrode and the pair of source/drain patterns,
   wherein the gate spacer comprises a plurality of first spacer patterns and a plurality of second spacer patterns that are alternately stacked on sidewalls of the pair of source/drain patterns,
   wherein each of the plurality of first spacer patterns is a semiconductor spacer pattern, and
   wherein each of the plurality of second spacer patterns is a dielectric spacer pattern comprising silicon.

2. The semiconductor device of claim 1, wherein each of the plurality of first spacer patterns and each of the plurality of second spacer patterns is in contact with a sidewall of one of the pair of source/drain patterns.

3. The semiconductor device of claim 1, wherein each of the plurality of first spacer patterns and each of the plurality of second spacer patterns has a C shape, and wherein both end portions of each of the plurality of first spacer patterns and each of the plurality of second spacer patterns are in contact with a sidewall of one of the pair of source/drain patterns.

4. The semiconductor device of claim 1,
   wherein the dielectric spacer pattern of each of the plurality of second spacer patterns comprises silicon oxide.

5. The semiconductor device of claim 4, wherein the plurality of first spacer patterns and the plurality of channel layers comprise a common material.

6. The semiconductor device of claim 1, wherein a thickness of each of the plurality of first spacer patterns is equal to or greater than a thickness of each of the plurality of second spacer patterns, and
   wherein a thickness of one of the plurality of second spacer patterns is in a range of about 0.5 nm to about 1.5 nm.

7. The semiconductor device of claim 1, further comprising a gate dielectric pattern provided between the gate electrode and the plurality of channel layers,
   wherein the gate dielectric pattern extends between the gate electrode and the gate spacer, and
   wherein each of the plurality of first spacer patterns and the plurality of second spacer patterns extends along a sidewall of the gate dielectric pattern from a bottom surface of one of the plurality of channel layers, and extends along a top surface of another of the plurality of channel layers from the sidewall of the gate dielectric pattern.

8. The semiconductor device of claim 1, wherein the gate spacer further comprises a third spacer pattern that is surrounded by an innermost one of the plurality of second spacer patterns.

9. The semiconductor device of claim 8, wherein the third spacer pattern and the plurality of first spacer patterns comprise a common material, and
   wherein a thickness of the third spacer pattern is greater than a thickness of each of the plurality of first spacer patterns and greater than a thickness of each of the plurality of second spacer patterns.

10. The semiconductor device of claim 1, wherein the plurality of second spacer patterns comprise:
    a plurality of first patterns surrounding an innermost one of the plurality of first spacer patterns; and a second pattern provided between the innermost one of the plurality of first spacer patterns and a sidewall of one of the pair of source/drain patterns,
wherein a thickness of the second pattern is greater than a thickness of each of the plurality of first patterns.

11. The semiconductor device of claim 10, wherein the thickness of the second pattern is about 1.5 times to about 2 times the thickness of each of the plurality of first patterns.

12. The semiconductor device of claim 10, wherein each of the plurality of first patterns has a C shape,
wherein both end portions of each of the plurality of first patterns are in contact with the sidewall, and
wherein the second pattern is in continuous contact with the sidewall between ends of the innermost one of the innermost one of the plurality of first spacer patterns.

13. The semiconductor device of claim 1, wherein the gate spacer comprises a plurality of gate spacers, and
wherein a lowermost one of the plurality of gate spacers extends onto a bottom surface of one of the pair of source/drain patterns.

14. The semiconductor device of claim 13, wherein each of the pair of source/drain patterns is vertically spaced apart from the active pattern by one of the plurality of gate spacers.

15. A semiconductor device, comprising:
an active pattern provided on a substrate and extending in a first direction;
a pair of source/drain patterns provided on the active pattern and spaced apart from each other in the first direction;
a plurality of channel layers vertically stacked and spaced apart from each other on the active pattern between the pair of source/drain patterns;
a gate electrode extending in a second direction between the pair of source/drain patterns, the gate electrode being provided on the active pattern and surrounding the plurality of channel layers, and the second direction intersecting the first direction;
a gate dielectric pattern provided between the pair of source/drain patterns and the plurality of channel layers;
a plurality of first gate spacers vertically extending from a top surface of an uppermost one of the plurality of channel layers past a top surface of the gate electrode;
a plurality of second gate spacers provided between the gate electrode and the pair of source/drain patterns, the plurality of second gate spacers overlapping the plurality of first gate spacers along a third direction perpendicular to the first direction and the second direction;
a gate capping pattern provided between the plurality of first gate spacers on the top surface of the gate electrode;
an interlayer dielectric layer provided on top surfaces of the pair of source/drain patterns, sidewalls of the plurality of first gate spacers, and a top surface of the gate capping pattern;
a plurality of active contacts penetrating the interlayer dielectric layer to the pair of source/drain patterns; and
a gate contact penetrating the gate capping pattern and the interlayer dielectric layer to the gate electrode,
wherein each of the plurality of second gate spacers comprises a plurality of first spacer patterns alternately stacked with a plurality of second spacer patterns that on a sidewall of the gate dielectric pattern,
wherein each of the plurality of first spacer patterns is a semiconductor spacer pattern, and
wherein each of the plurality of second spacer patterns is a dielectric spacer pattern comprising silicon.

16. The semiconductor device of claim 15,
wherein the plurality of second spacer patterns of each of the plurality of second gate spacers comprise silicon oxide.

17. The semiconductor device of claim 15, wherein a number of the plurality of first spacer patterns is equal to or greater than two, and
wherein a number of the plurality of second spacer patterns is equal to or greater than two.

18. The semiconductor device of claim 15, wherein both end portions of each of the plurality of first spacer patterns and the plurality of second spacer patterns are in contact with a sidewall of one of the pair of source/drain patterns.

19. The semiconductor device of claim 15, wherein a top surface of each of the pair of source/drain patterns is at a level higher than a level of the top surface of the uppermost one of the plurality of channel layers, and
wherein a level difference between the top surface of each of the pair of source/drain patterns and the top surface of the uppermost one of the plurality of channel layers is in a range of about 1 nm to about 10 nm.

20. A semiconductor device, comprising:
a substrate comprising a first cell region and a second cell region;
a first active pattern extending in a first direction on the first cell region, and a second active pattern extending in the first direction on the second cell region;
a pair of first source/drain patterns provided on the first active pattern, and a pair of second source/drain patterns provided on the second active pattern;
a plurality of channel layers vertically stacked and spaced apart from each other on each of the first active pattern and the second active pattern, the plurality of channel layers provided on the first active pattern being provided between the pair of first source/drain patterns, and the plurality of channel layers provided on the second active pattern being provided between the pair of second source/drain patterns;
a gate electrode extending in a second direction between the pair of first source/drain patterns and between the pair of second source/drain patterns, the gate electrode crossing both the first active pattern and the second active pattern, and surrounding the plurality of channel layers, and the second direction intersecting the first direction; and
a gate spacer provided between the pair of first source/drain patterns and the gate electrode, and between the pair of second source/drain patterns and the gate electrode,
wherein the gate spacer comprises a plurality of first spacer patterns and a plurality of second spacer patterns that are alternately stacked on a sidewall of the gate electrode,
wherein each of the plurality of first spacer patterns is a semiconductor spacer pattern, and
wherein each of the plurality of second spacer patterns is a dielectric spacer pattern comprising silicon.

* * * * *